(12) United States Patent
Nozawa et al.

(10) Patent No.: US 11,910,625 B2
(45) Date of Patent: Feb. 20, 2024

(54) IMAGING DEVICE AND METHOD FOR DRIVING IMAGING DEVICE

(71) Applicant: Panasonic Intellectual Property Management Co., Ltd., Osaka (JP)

(72) Inventors: Katsuya Nozawa, Osaka (JP); Takeyoshi Tokuhara, Osaka (JP); Nozomu Matsukawa, Nara (JP); Sanshiro Shishido, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 422 days.

(21) Appl. No.: 17/219,954

(22) Filed: Apr. 1, 2021

(65) Prior Publication Data

US 2021/0225939 A1    Jul. 22, 2021

Related U.S. Application Data

(63) Continuation of application No. PCT/JP2020/002167, filed on Jan. 22, 2020.

(30) Foreign Application Priority Data

Feb. 20, 2019  (JP) ................................ 2019-027990

(51) Int. Cl.
*H10K 39/32* (2023.01)
*H04N 5/33* (2023.01)
(Continued)

(52) U.S. Cl.
CPC ............... *H10K 39/32* (2023.02); *H04N 5/33* (2013.01); *H04N 25/709* (2023.01);
(Continued)

(58) Field of Classification Search
CPC ..................................................... H10K 39/32
See application file for complete search history.

(56) References Cited

U.S. PATENT DOCUMENTS

| 4,894,526 A | 1/1990 | Bethea et al. |
| 5,965,875 A | 10/1999 | Merrill |

(Continued)

FOREIGN PATENT DOCUMENTS

| JP | 63-246626 | 10/1988 |
| JP | 9-121061 | 5/1997 |

(Continued)

OTHER PUBLICATIONS

International Search Report of PCT application No. PCT/JP2020/002167 dated Apr. 7, 2020.

*Primary Examiner* — Erik Kielin
(74) *Attorney, Agent, or Firm* — Rimon P.C.

(57) ABSTRACT

An imaging device includes a pixel electrode, a counter electrode that faces the pixel electrode, a first photoelectric conversion layer that is located between the pixel electrode and the counter electrode and that generates first signal charge, a second photoelectric conversion layer that is located between the first photoelectric conversion layer and the pixel electrode and that generates second signal charge, a first barrier layer that is located between the first photoelectric conversion layer and the second photoelectric conversion layer and that forms a first heterojunction barrier against the first signal charge in the first photoelectric conversion layer, and a charge accumulator that is electrically connected to the pixel electrode and that accumulates the first signal charge and the second signal charge.

14 Claims, 21 Drawing Sheets

(51) Int. Cl.
*H04N 25/709* (2023.01)
*H10K 30/30* (2023.01)
*H10K 10/29* (2023.01)
*H10K 30/20* (2023.01)

(52) U.S. Cl.
CPC .......... *H10K 10/29* (2023.02); *H10K 30/211* (2023.02); *H10K 30/30* (2023.02)

(56) References Cited

U.S. PATENT DOCUMENTS

| | | |
|---|---|---|
| 6,326,650 B1 | 12/2001 | Allam |
| 2016/0111457 A1 | 4/2016 | Sekine |
| 2018/0227490 A1 | 8/2018 | Nakata et al. |
| 2018/0227524 A1* | 8/2018 | Machida ................ H04N 25/76 |
| 2018/0227526 A1* | 8/2018 | Tokuhara ............. H04N 25/585 |
| 2018/0294316 A1 | 10/2018 | Tokuhara et al. |
| 2019/0081107 A1* | 3/2019 | Nakata ............... H01L 27/14669 |

FOREIGN PATENT DOCUMENTS

| | | |
|---|---|---|
| JP | 2006-245284 | 9/2006 |
| JP | 2010-283787 | 12/2010 |
| JP | 2012-109434 | 6/2012 |
| JP | 2015-056408 | 3/2015 |
| JP | 2018-125495 | 8/2018 |
| JP | 2018-125839 | 8/2018 |
| JP | 2018-182314 | 11/2018 |

* cited by examiner

IMAGING DEVICE AND METHOD FOR DRIVING IMAGING DEVICE

BACKGROUND

1. Technical Field

The present disclosure relates to an imaging device and a method for driving the imaging device.

2. Description of the Related Art

An imaging device in which photoelectric conversion elements whose spectral sensitivity characteristics are different from one another are stacked on one another is known.

U.S. Pat. No. 5,965,875 discloses an imaging device including photoelectric conversion regions in a single-crystal semiconductor. The thickness of each of the photoelectric conversion regions is adjusted such that the photoelectric conversion region absorbs blue light, green light, and red light from a front surface side. Signal charge generated as a result of photoelectric conversion is read from an electrode connected to each of the photoelectric conversion regions.

Japanese Patent No. 5604703 discloses a configuration in which an impurity region that has an opposite conduction system to a photodiode and that separates the photodiode in a vertical direction halfway in a thickness direction of the photodiode is provided. In Japanese Patent No. 5604703, the barrier height of the impurity region is controlled using pulse voltage applied to an accumulation gate in order to control transfer of signal charge between parts of the photodiode separated in an incident direction. As a result, signal charge can be read without providing an electrode for each of photodiodes stacked on one another.

SUMMARY

In one general aspect, the techniques disclosed here feature an imaging device including a pixel electrode, a counter electrode that faces the pixel electrode, a first photoelectric conversion layer that is located between the pixel electrode and the counter electrode and that generates first signal charge, a second photoelectric conversion layer that is located between the first photoelectric conversion layer and the pixel electrode and that generates second signal charge, a first barrier layer that is located between the first photoelectric conversion layer and the second photoelectric conversion layer and that forms a first heterojunction barrier against the first signal charge in the first photoelectric conversion layer, and a charge accumulator that is electrically connected to the pixel electrode and that accumulates the first signal charge and the second signal charge.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Outline of Present Disclosure

Figure 1:
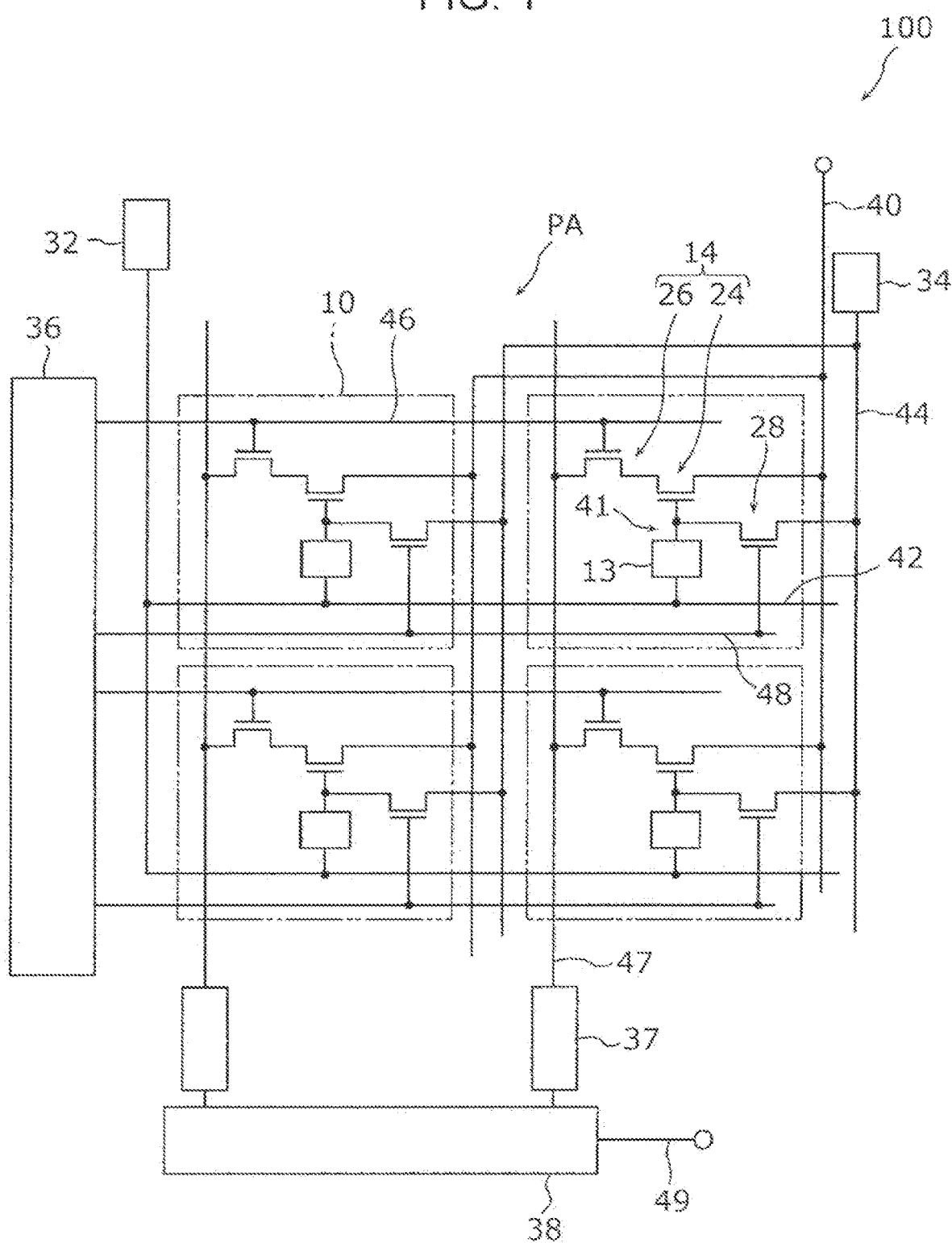
FIG. 1 is a circuit diagram illustrating an exemplary circuit configuration of an imaging device according to a first embodiment.

An imaging device according to an aspect of the present disclosure includes a pixel electrode, a counter electrode that faces the pixel electrode, a first photoelectric conversion layer that is located between the pixel electrode and the counter electrode and that generates first signal charge, a second photoelectric conversion layer that is located between the first photoelectric conversion layer and the pixel electrode and that generates second signal charge, a first barrier layer that is located between the first photoelectric conversion layer and the second photoelectric conversion layer and that forms a first heterojunction barrier against the first signal charge in the first photoelectric conversion layer, and a charge accumulator that is electrically connected to the pixel electrode and that accumulates the first signal charge and the second signal charge.

As a result, the first signal charge can be accurately held in the first photoelectric conversion layer by the first heterojunction barrier formed by the first barrier layer. The first and second signal charges, therefore, can be transferred at different timings using the pixel electrode and the counter electrode. That is, because an electrode need not be provided for each of the photoelectric conversion layers, a through-silicon via for reading charge from the electrode need not be provided for the photoelectric conversion layer. Because a space in which a through-silicon via is provided and that does not contribute to photoelectric conversion need not be provided, a large light receiving area can be secured. The resolution and sensitivity of the imaging device thus increase in this aspect. In addition, the height of the first heterojunction barrier can be easily adjusted by appropriately selecting a material of the first barrier layer. As a result, a reliable imaging device whose accuracy of confinement of the first signal charge to the first photoelectric conversion layer is achieved.

In addition, for example, the first barrier layer need not forma heterojunction barrier or may form a heterojunction barrier lower than the first heterojunction barrier against charge having a polarity opposite to a polarity of the second signal charge and being in the second photoelectric conversion layer.

As a result, the charge whose polarity is opposite that of the signal charge can be promptly discharged to a side of the counter electrode, and the amount of charge of the opposite polarity remaining in the photoelectric conversion layer can be reduced. Because disappearance of the signal charge and the charge of the opposite polarity due to recombination can be suppressed in the photoelectric conversion layer, a reliable imaging device is achieved.

In addition, for example, height of the first heterojunction barrier may be greater than or equal to 0.5 eV.

As a result, an effect of confining the first signal charge to the first photoelectric conversion layer is sufficiently produced.

In addition, for example, in a case where a potential difference between the pixel electrode and the counter electrode is a first potential difference, the first signal charge need not pass through the first heterojunction barrier and may be held in the first photoelectric conversion layer. In a case where the potential difference between the pixel electrode and the counter electrode is a second potential difference which is larger than the first potential difference, the first signal charge may pass through the first heterojunction barrier.

As a result, holding and transfer of the first signal charge can be switched by adjusting the potential difference between the pixel electrode and the counter electrode.

In addition, for example, the imaging device according to the aspect of the present disclosure may further include a voltage supply circuit electrically connected to the counter electrode. The voltage supply circuit may supply, in a first period, a first voltage to the counter electrode such that the potential difference between the pixel electrode and the counter electrode becomes the first potential difference and, in a second period which is different from the first period, a second voltage to the counter electrode such that the potential difference between the pixel electrode and the counter electrode becomes the second potential difference.

As a result, holding and transfer of the first signal charge can be switched at certain timings by adjusting the potential difference between the pixel electrode and the counter electrode using the voltage supply circuit.

In addition, for example, the imaging device according to the aspect of the present disclosure may further include a third photoelectric conversion layer that is located between the second photoelectric conversion layer and the pixel electrode and that generates third signal charge and a second barrier layer that is located between the second photoelectric conversion layer and the third photoelectric conversion layer and that forms a second heterojunction barrier against the second signal charge in the second photoelectric conversion layer.

As a result, the second signal charge can be accurately held in the second photoelectric conversion layer by the second heterojunction barrier formed by the second barrier layer. The first to third signal charges, therefore, can be transferred at different timings using the pixel electrode and the counter electrode. For example, when the first to third signal charges are prepared for red, green, and blue (RGB), respectively, the imaging device can generate a color image.

In addition, for example, the first heterojunction barrier may be higher than the second heterojunction barrier.

As a result, only the second signal charge can be accurately transferred by adjusting the potential difference between the pixel electrode and the counter electrode. That is, the second signal charge passes through the second heterojunction barrier and is collected by the pixel electrode with the first signal charge held in the first photoelectric conversion layer.

In addition, for example, a thickness of the first barrier layer may be greater than a thickness of the second barrier layer.

As a result, only the second signal charge can be accurately transferred by adjusting the potential difference between the pixel electrode and the counter electrode. That is, the second signal charge passes through the second heterojunction barrier and is collected by the pixel electrode with the first signal charge held in the first photoelectric conversion layer.

In addition, for example, the first barrier layer may contain a fullerene.

As a result, a first heterojunction barrier that effectively confines the first signal charge can be formed.

In addition, for example, a spectral sensitivity characteristic of the first photoelectric conversion layer may be different from a spectral sensitivity characteristic of the second photoelectric conversion layer.

As a result, imaging based on different spectra can be performed. For example, an image in an infrared range and an image in a visible range can be generated.

In addition, for example, the first photoelectric conversion layer may be sensitive to visible light. The second photoelectric conversion layer may be sensitive to infrared light.

As a result, since the first photoelectric conversion layer, which is located on a side of the counter electrode, absorbs visible light, the first photoelectric conversion layer is not affected by the second photoelectric conversion layer, and sensitivity thereof to visible light increases.

In addition, for example, the first photoelectric conversion layer may be sensitive to infrared light. The second photoelectric conversion layer may be sensitive to visible light.

Thermal charge that can cause noise tends to be generated in the first photoelectric conversion layer, which is sensitive to infrared light. With the imaging device according to this aspect, however, thermal charge generated in the first photoelectric conversion layer is held in the first photoelectric conversion layer by the first heterojunction barrier and hardly affects reading of signal charge in the second photoelectric conversion layer. A signal-to-noise (S/N) ratio in the reading of the signal charge in the second photoelectric conversion layer, therefore, increases. As a result, with the imaging device according to this aspect, a visible light image with little noise can be generated.

In addition, for example, a spectral sensitivity characteristic of the first photoelectric conversion layer may be the same as a spectral sensitivity characteristic of the second photoelectric conversion layer.

As a result, low sensitivity and high sensitivity can be switched by switching reading of signal charge from a photoelectric conversion layer in accordance with the amount of light incident on the imaging device. In other words, a range within which the imaging device can perform photoelectric conversion, that is, a dynamic range, increases.

In addition, for example, a method for driving an imaging device according to another aspect of the present disclosure is a method for driving an imaging device including a photoelectric converter that includes a second photoelectric conversion layer, a barrier layer, a first photoelectric conversion layer, and a counter electrode are stacked on a pixel electrode in this order, the barrier layer forming a heterojunction barrier against first signal charge generated in the first photoelectric conversion layer. The method includes (a) setting a potential difference between the pixel electrode and the counter electrode to a first potential difference, to cause second signal charge generated in the second photoelectric conversion layer to be collected by the pixel electrode while the first signal charge is held in the first photoelectric conversion layer using the heterojunction barrier; and (b) setting the potential difference between the pixel electrode and the counter electrode to a second potential difference which is larger than the first potential difference, to cause the first signal charge to pass through the heterojunction barrier and to be collected by the pixel electrode.

As a result, since the first signal charge is held in the first photoelectric conversion layer by the heterojunction barrier in a period in which the second signal charge is transferred, mixing of the first and second signal charges is suppressed. The first and second signal charges, therefore, can be accurately read at different timings.

Embodiments will be specifically described hereinafter with reference to the drawings.

The embodiments that will be described hereinafter are general or specific examples. Values, shapes, materials, components, arrangement positions and connection modes of the components, steps, order of the steps, and the like mentioned in the following embodiments are examples, and do not limit the present disclosure. Among the components described in the following description, ones not described in the independent claims will be described as optional components.

The drawings are schematic diagrams and not necessarily exact. Scales, for example, do not match the reality in each of the drawings. In the drawings, substantially the same components are given the same reference numerals, and redundant description is omitted or simplified.

Terms indicating relationships between elements, such as "equal to each other", terms indicating shapes of elements, such as "square" and "circle", and ranges of values herein are not exact expressions but substantial expressions that can include errors of, say, several percent.

Terms "above" and "below" herein do not refer to upward (vertically above) and downward (vertically below) in absolute spatial recognition but are defined by relative positional relationships based on order of stacking of layers in a multilayer structure. The terms "above" and "below" will be used not only when two components are arranged with a gap provided therebetween and another component is disposed in the gap but also when two components are arranged in contact with each other.

First Embodiment

1. Circuit Configuration of Imaging Device

First, the circuit configuration of an imaging device according to a first embodiment will be described with reference to FIG. 1.

FIG. 1 is a circuit diagram illustrating an exemplary circuit configuration of the imaging device according to the present embodiment. An imaging device 100 illustrated in FIG. 1 includes a pixel array PA including pixels 10 arranged in two dimensions. FIG. 1 schematically illustrates an example in which the pixels 10 are arranged in a 2×2 matrix. The number and arrangement of pixels 10 in the imaging device 100 are not limited to the example illustrated in FIG. 1. For example, the imaging device 100 may be a line sensor in which pixels 10 are arranged in a line. Alternatively, the number of pixels 10 included in the imaging device 100 may be one.

Each of the pixels 10 includes a photoelectric conversion unit 13 and a signal detection circuit 14. The photoelectric conversion unit 13 receives incident light and generates a signal. The photoelectric conversion unit 13 need not be an independent element for each of the pixels 10, and a part of the photoelectric conversion unit 13, for example, may be shared by two or more pixels 10. The signal detection circuit 14 detects signal generated by the photoelectric conversion unit 13. In this example, the signal detection circuit 14 includes a signal detection transistor 24 and an address transistor 26. The signal detection transistor 24 and the address transistor 26 are typically field-effect transistors (FETs). Here, n-channel metal-oxide-semiconductor field-effect transistors (MOSFETs) are used as an example of the signal detection transistor 24 and the address transistor 26. Transistors such as the signal detection transistor 24, the address transistor 26, and a reset transistor 28, which will be described later, each include a control terminal, an input terminal, and an output terminal. The control terminal is, for example, a gate. The input terminal is, for example, either a drain or a source and may be, for example, the drain. The output terminal is another of the drain and the source and may be, for example, the source.

As schematically illustrated in FIG. 1, the control terminal of the signal detection transistor 24 is electrically connected to the photoelectric conversion unit 13. Signal charge generated by the photoelectric conversion unit 13 is accumulated in a charge accumulation node 41 between the gate of the signal detection transistor 24 and the photoelectric conversion unit 13. Here, the signal charge is holes or electrons. The charge accumulation node 41 is an example of a charge accumulator and also called a "floating diffusion node". The charge accumulation node 41 will be also referred to as a "charge accumulation region" herein. Details of the structure of the photoelectric conversion unit 13 will be described later.

The photoelectric conversion unit 13 of each of the pixels 10 is also connected to a bias control line 42. In the configuration illustrated in FIG. 1, the bias control line 42 is connected to a voltage supply circuit 32. The voltage supply circuit 32 is configured to be able to supply at least two types of voltage. During the operation of the imaging device 100, the voltage supply circuit 32 supplies a certain voltage to the photoelectric conversion unit 13 via the bias control line 42. The voltage supply circuit 32 is not limited to a certain power supply circuit and may be a circuit that generates the certain voltage or a circuit that converts a voltage supplied from another power supply into the certain voltage. As will be described in detail later, movement of signal charge from the photoelectric conversion unit 13 to the charge accumulation node 41 is controlled by switching the voltage supplied from the voltage supply circuit 32 to the photoelectric conversion unit 13 between different values. An example of the operation of the imaging device 100 will be described later.

The pixels 10 are each connected to a power supply line 40 used to supply a power supply voltage VDD. As illustrated in FIG. 1, the input terminal of the signal detection transistor 24 is connected to the power supply line 40. When the power supply line 40 functions as a source follower power supply, the signal detection transistor 24 amplifies a signal generated by the photoelectric conversion unit 13 and outputs the amplified signal.

The input terminal of the address transistor 26 is connected to the output terminal of the signal detection transistor 24. The output terminal of the address transistor 26 is connected to one of vertical signal lines 47 provided for columns of the pixel array PA. The control terminal of the address transistor 26 is connected to an address control line 46. An output of the signal detection transistor 24 can be selectively read by a corresponding vertical signal line 47 by controlling potential of the address control line 46.

In the example illustrated in FIG. 1, the address control line 46 is connected to a vertical scanning circuit 36. The vertical scanning circuit 36 is also called a "row scanning circuit". The vertical scanning circuit 36 applies a certain voltage to the address control lines 46 to select the pixels 10 arranged in each of rows in units of rows. As a result, reading of signals from the selected pixels 10 and resetting of the charge accumulation nodes 41 are performed.

The vertical signal lines 47 are main signal lines for transferring pixel signals from the pixel array PA to peripheral circuits. Column signal processing circuits 37 are connected to the vertical signal lines 47. The column signal processing circuits 37 are also called "row signal accumulation circuits". The column signal processing circuits 37 perform, for example, noise suppression signal processing, which is typified by correlated double sampling, and analog-to-digital conversion. As illustrated in FIG. 1, each of the column signal processing circuits 37 is provided for one of the columns of the pixels 10. A horizontal signal reading circuit 38 is connected to the column signal processing circuits 37. The horizontal signal reading circuit 38 is also called a "column scanning circuit". The horizontal signal reading circuit 38 sequentially reads signals from the column signal processing circuits 37 and outputs the signals to a horizontal common signal line 49.

In the configuration illustrated in FIG. 1, the pixels 10 each include a reset transistor 28. As with the signal detection transistor 24 and the address transistor 26, for example, the reset transistor 28 is an FET. In the following description, an example in which an n-channel MOSFET is used as the reset transistor 28 will be described unless otherwise specified. As illustrated in FIG. 1, the reset transistor 28 is connected between a reset voltage line 44 for supplying a reset voltage Vr and the charge accumulation node 41. The control terminal of the reset transistor 28 is connected to a reset control line 48. Potential of the charge accumulation node 41 can be reset to the reset voltage Vr by controlling potential of the reset control line 48. In this example, the reset control line 48 is connected to the vertical scanning circuit 36. The pixels 10 arranged in each of the rows, therefore, can be reset in units of rows by applying a certain voltage to the reset control lines 48 using the vertical scanning circuit 36.

In this example, the reset voltage line 44 for supplying the reset voltage Vr to the reset transistor 28 is connected to a reset voltage source 34. The reset voltage source 34 is also called a "reset voltage supply circuit". The reset voltage source 34 may be configured to be able to supply the certain reset voltage Vr to the reset voltage line 44 during the operation of the imaging device 100 and, as with the voltage supply circuit 32, is not limited to a certain power supply circuit. The voltage supply circuit 32 and the reset voltage source 34 may be parts of the same voltage supply circuit or may be separate voltage supply circuits. One or both of the voltage supply circuit 32 and the reset voltage source 34 may be a part of the vertical scanning circuit 36. Alternatively, a control voltage from the voltage supply circuit 32 and/or the reset voltage Vr from the reset voltage source 34 may be supplied to the pixels 10 through the vertical scanning circuit 36.

The power supply voltage VDD of the signal detection circuit 14 may be used as the reset voltage Vr, instead. In this case, a voltage supply circuit (not illustrated in FIG. 1) that supplies a power supply voltage to the pixels 10 and the reset voltage source 34 can be integrated with each other. Because the power supply line 40 and the reset voltage line 44 can also be integrated with each other, wiring in the pixel array PA can be simplified. When the reset voltage Vr is different from the power supply voltage VDD supplied by the signal detection circuit 14, however, the imaging device 100 can perform more flexible control.

2. Cross-Sectional Structure of Pixels

Next, the cross-sectional structure of the pixels 10 of the imaging device 100 according to the present embodiment will be described with reference to FIG. 2.

Figure 2:
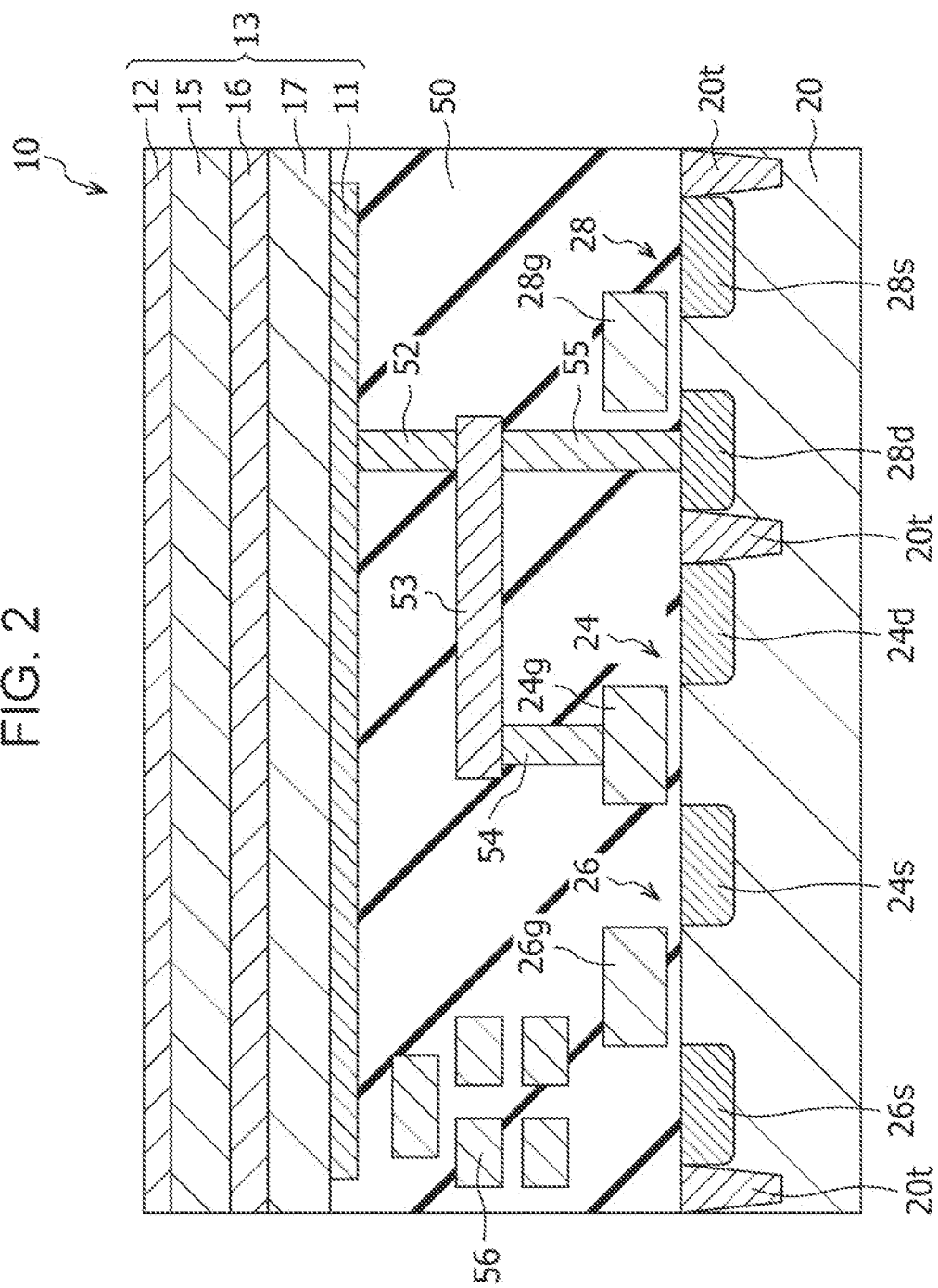
FIG. 2 is a schematic cross-sectional view of the cross-sectional structure of one of pixels of the imaging device according to the first embodiment.

FIG. 2 is a schematic cross-sectional view of the cross-sectional structure of one of the pixels 10 of the imaging device 100 according to the present embodiment. In the structure illustrated in FIG. 2, the signal detection transistor 24, the address transistor 26, and the reset transistor 28 are formed on a semiconductor substrate 20. The semiconductor substrate 20 is not limited to a substrate entirely composed of a semiconductor. The semiconductor substrate 20 may be an insulating substrate having a surface on which a photo-sensitive area and a semiconductor layer are provided, instead. An example in which a p-type silicon (Si) substrate is used as the semiconductor substrate 20 will be described hereinafter.

The semiconductor substrate 20 includes impurity regions 26s, 24s, 24d, 28d, and 28s and element isolation regions 20t for electrically isolating the pixels 10 with one another. The impurity regions 26s, 24s, 24d, 28d, and 28s are n-type regions. An element isolation region 20t is also provided between the impurity regions 24d and 28d. The element isolation regions 20t are formed, for example, by implanting an acceptor through ion implantation under certain implantation conditions.

The impurity regions 26s, 24s, 24d, 28d, and 28s are, for example, an impurity diffusion layer formed in the semiconductor substrate 20. As schematically illustrated in FIG. 2, the signal detection transistor 24 includes the impurity regions 24s and 24d and a gate electrode 24g. The gate electrode 24g is composed of a conductive material. The conductive material is, for example, polysilicon that has conductivity as a result of impurity doping, but may be a metal material, instead. The impurity region 24s functions, for example, as a source region of the signal detection transistor 24. The impurity region 24d functions, for example, as a drain region of the signal detection transistor 24. A channel region of the signal detection transistor 24 is formed between the impurity regions 24s and 24d.

Similarly, the address transistor 26 includes impurity regions 26s and 24s and a gate electrode 26g. The gate electrode 26g is composed of a conductive material. The conductive material is, for example, polysilicon that has conductivity as a result of impurity doping, but may be a metal material. The impurity region 26g is connected to one of the address control lines 46, which are not illustrated in FIG. 2. In this example, the signal detection transistor 24 and the address transistor 26 are electrically connected to each other by sharing the impurity region 24s. The impurity region 24s functions, for example, as a drain region of the address transistor 26. The impurity region 26s functions, for example, as a source region of the address transistor 26. The impurity region 26s is connected to one of the vertical signal lines 47, which are not illustrated in FIG. 2. The impurity region 24s need not be shared by the signal detection transistor 24 and the address transistor 26. More specifically, the source region of the signal detection transistor 24 and the drain region of the address transistor 26 may be separated from each other on the semiconductor substrate 20 and electrically connected to each other via wiring layers 56 provided in an interlayer insulating layer 50.

The reset transistor 28 includes impurity regions 28d and 28s and a gate electrode 28g. The gate electrode 28g is composed, for example, of a conductive material. The conductive material is, for example, polysilicon that has conductivity as a result of impurity doping, but may be a metal material. The impurity region 28g is connected to one of the reset control lines 48, which are not illustrated in FIG. 2. The impurity region 28s functions, for example, as a source region of the reset transistor 28. The impurity region 28s is connected to one of the reset voltage lines 44, which are not illustrated in FIG. 2. The impurity region 28d functions, for example, as a drain region of the reset transistor 28.

The interlayer insulation layer 50 is provided on the semiconductor substrate 20 in such a way as to cover the signal detection transistor 24, the address transistor 26, and the reset transistor 28. The interlayer insulation layer 50 is composed, for example, of an insulating material such as silicon dioxide. As illustrated in FIG. 2, the wiring layers 56 are provided in the interlayer insulation layer 50. The wiring layers 56 are typically composed of a metal such as copper. The wiring layers 56 may include, for example, signal lines such as the vertical signal lines 47 or power supply lines as a part thereof. The number of insulating layers in the interlayer insulation layer 50 and the number of layers included in the wiring layers 56 provided in the interlayer insulation layer 50 may be set as desired and are not limited to the example illustrated in FIG. 2.

As illustrated in FIG. 2, a plug 52, a wire 53, and contact plugs 54 and 55 are also provided in the interlayer insulation layer 50. The wire 53 may be a part of the wiring layers 56. The plug 52, the wire 53, and the contact plugs 54 and 55 are each composed of a conductive material. The plug 52 and the wire 53, for example, are composed of a metal such as copper. The contact plugs 54 and 55, for example, are composed of polysilicon that has conductivity as a result of impurity doping. The plug 52, the wire 53, and the contact plugs 54 and 55 may be composed of the same material or different materials.

The plug 52, the wire 53, and the contact plug 54 constitute at least a part of the charge accumulation node 41 between the signal detection transistor 24 and the photoelectric conversion unit 13. In the structure illustrated in FIG. 2, the gate electrode 24g of the signal detection transistor 24, the plug 52, the wire 53, the contact plugs 54 and 55, and the impurity region 28d, which is either the source region or the drain region of the reset transistor 28 function as a charge accumulation region for accumulating signal charge collected by a pixel electrode 11 of the photoelectric conversion unit 13.

More specifically, the pixel electrode 11 of the photoelectric conversion unit 13 is connected to the gate electrode 24g of the signal detection transistor 24 via the plug 52, the wire 53, and the contact plug 54. In other words, the gate of the signal detection transistor 24 is electrically connected to the pixel electrode 11. The pixel electrode 11 is also connected to the impurity region 28d via the plug 52, the wire 53, and the contact plug 55.

As the pixel electrode 11 collects signal charge, a voltage according to the amount of signal charge accumulated in the charge accumulation region is applied to the gate of the signal detection transistor 24. The signal detection transistor 24 amplifies the voltage. The voltage amplified by the signal detection transistor 24 is selectively read by the address transistor 26 as signal voltage.

The photoelectric conversion unit 13 is arranged above the interlayer insulation layer 50. The pixels 10 arranged in two dimensions when the semiconductor substrate 20 is viewed as a plan form the photosensitive area. The photosensitive area is also called a "pixel area". A distance between two adjacent pixels 10, that is, pixel pitch, may be, say, about 2 μm.

3. Configuration of Photoelectric Conversion Unit

A specific configuration of the photoelectric conversion unit 13 will be described hereinafter.

As illustrated in FIG. 2, the photoelectric conversion unit 13 includes the pixel electrode 11, a counter electrode 12, and a photoelectric conversion layer 15, a barrier layer 16, and a photoelectric conversion layer 17 provided between the pixel electrode 11 and the counter electrode 12. The counter electrode 12, the photoelectric conversion layer 15, the barrier layer 16, the photoelectric conversion layer 17, and the pixel electrode 11 are arranged in this order from a side of the imaging device 100 on which light is incident in the present embodiment.

In the example illustrated in FIG. 2, the counter electrode 12, the photoelectric conversion layer 15, the barrier layer 16, and the photoelectric conversion layer 17 are formed over a plurality of pixels 10. The pixel electrode 11 is provided for each of the pixels 10. The pixel electrode 11 of one of the pixels 10 is electrically isolated from the pixel electrode 11 of another pixel 10 because these pixel electrodes 11 are spatially separated from each other. At least one of the counter electrode 12, the photoelectric conversion layer 15, the barrier layer 16, or the photoelectric conversion layer 17 may be separately provided for each of the pixels 10.

3-1. Pixel Electrode and Counter Electrode

The pixel electrode 11 is an electrode for reading signal charge generated by the photoelectric conversion unit 13. There is at least one pixel electrode 11 for each of the pixels 10. The pixel electrode 11 is electrically connected to the gate electrode 24g of the signal detection transistor 24 and the impurity region 28d.

The pixel electrode 11 is composed of a conductive material. The conductive material is, for example, a metal such as aluminum or copper, a metal nitride, or polysilicon that has conductivity as a result of impurity doping.

The counter electrode 12 is, for example, a transparent electrode composed of a transparent conductive material. The counter electrode 12 is arranged on a side of the photoelectric conversion layer 15 on which light is incident. Light that has passed through the counter electrode 12, therefore, is incident on the photoelectric conversion layer 15. Light detected by the imaging device 100 is not limited to light within a wavelength range of visible light. For example, the imaging device 100 may detect infrared light or ultraviolet light. The wavelength range of visible light is, for example, 380 nm to 780 nm.

A term "transparent" herein means that an object passes at least a part of light within a wavelength range to be detected and that the object need not pass light over the entirety of the wavelength range of visible light. A term "light" herein refers to electromagnetic waves in general including infrared light and ultraviolet light.

The counter electrode 12 is composed, for example, of a transparent conducting oxide (TCO) such as ITO, IZO, AZO, FTO, $SnO_2$, $TiO_2$, or $ZnO_2$. The voltage supply circuit 32 illustrated in FIG. 1 is connected to the counter electrode 12. By adjusting voltage applied by the voltage supply circuit 32 to the counter electrode 12, a potential difference between the counter electrode 12 and the pixel electrode 11 can be set and kept at a desired value.

As described with reference to FIG. 1, the counter electrode 12 is connected to the bias control line 42 connected to the voltage supply circuit 32. The counter electrode 12 is formed over a plurality of pixels 10. The voltage supply circuit 32, therefore, can collectively apply a desired control voltage to the plurality of pixels 10 via the bias control lines 42. Alternatively, the counter electrode 12 may be separately provided for each of the pixels 10 insofar as the voltage supply circuit 32 can apply a desired control voltage.

As described in detail later, the voltage supply circuit 32 supplies different voltages to the counter electrode 12 between an exposure period and a non-exposure period. The "exposure period" herein refers to a period for which signal charge generated as a result of photoelectric conversion is accumulated in the photoelectric conversion layer 15 or the charge accumulation region and may be called a "charge accumulation period", instead. Periods in which the imaging device 100 operates and that are other than exposure periods will be referred to as "non-exposure periods" herein. The non-exposure periods are not limited to periods in which incidence of light on the photoelectric conversion unit 13 is prevented and may include periods in which light is radiated onto the photoelectric conversion unit 13. The non-exposure periods also include periods in which signal charge is unintentionally accumulated in the charge accumulation region due to parasitic sensitivity.

When the voltage supply circuit 32 controls potential of the counter electrode 12 against potential of the pixel electrode 11, the pixel electrode 11 can collect, as signal charge, either holes or electrons of hole-electron pairs generated in the photoelectric conversion layer 15 as a result of photoelectric conversion. When holes are used as signal charge, for example, the pixel electrode 11 can selectively collect the holes by making the potential of the counter electrode 12 higher than that of the pixel electrode 11. A case where holes are used as signal charge will be described hereinafter. It is needless to say that electrons may be used as signal charge, and in this case, the potential of the counter electrode 12 may be made lower than that of the pixel electrode 11. When an appropriate bias voltage is applied between the counter electrode 12 and the pixel electrode 11, the pixel electrode 11, which faces the counter electrode 12, collects either positive or negative charge generated in the photoelectric conversion layer 15 as a result of photoelectric conversion.

In the present embodiment, at least one of the signal detection circuit 14 or the voltage supply circuit 32 can be integrated on the same substrate as the photoelectric conversion unit 13. Alternatively, at least one of the signal detection circuit 14 or the voltage supply circuit 32 may be formed on a substrate different from the one on which the photoelectric conversion unit 13 is formed.

3-2. Photoelectric Conversion Layer

The photoelectric conversion layer 15 is located between the pixel electrode 11 and the counter electrode 12 and is an example of a first photoelectric conversion layer that generates first signal charge. The photoelectric conversion layer 17 is located between the photoelectric conversion layer 15 and the pixel electrode 11 and is an example of a second photoelectric conversion layer that generates second signal charge. The first and second signal charges are of the same polarity.

In the present embodiment, both the photoelectric conversion layers 15 and 17 absorb photon and generate photocharge. More specifically, the photoelectric conversion layers 15 and 17 receive incident light and generate a hole-electron pair. That is, the first and second signal charges are either holes or electrons. Although a case where the first and second signal charges are holes will be described in the present embodiment, the first and second signal charges may be electrons, instead. The pixel electrode 11 collects holes, which are the first and second signal charges. The counter electrode 12 collects electrons, which are charge whose polarity is opposite that of the first and second signal charges.

The photoelectric conversion layers 15 and 17 are composed, for example, of organic semiconductor materials. More specifically, the photoelectric conversion layers 15 and 17 contain donor molecules having absorbance and acceptor molecules having charge attraction. A donor molecule absorbs a photon and generates a hole and an electron. An acceptor molecule extracts, from the donor molecule, either the hole or the electron generated in the donor molecule. After the acceptor molecule extracts the hole or the electron, the donor molecule includes only another of the hole and the electro, and the acceptor molecule includes charge whose polarity of opposite that of the charge included in the donor molecule.

The donor molecules are, for example, a low molecular weight organic semiconductor such as a phthalocyanine or a naphthalocyanine, an organic semiconductor polymer such as poly(3-hexylthiophene-2,5-diyl) (P3HT), or a semiconductor carbon nanotube. The wavelength dependence of absorption coefficients of organic semiconductors and organic semiconductor polymers varies depending on the material. The resonant absorption wavelength of semiconductor carbon nanotubes greatly varies depending on a chiral index.

For example, tris(8-hydroxyquinolinato)aluminum ($Alq_3$), which is an example of the organic semiconductor exhibits best absorption in a blue range. N,N'-Dimethylquinacridone, which is another example of the organic semiconductor, exhibits best absorption in a green range. Zinc phthalocyanine, which is another example of the organic semiconductor, exhibits best absorption in a red range.

In the present embodiment, the photoelectric conversion layers 15 and 17 have different spectral sensitivity characteristics. By using different types of donor molecule for the photoelectric conversion layers 15 and 17, the spectral sensitivity characteristics of the photoelectric conversion layers 15 and 17 become different from each other. $Alq_3$, for example, is used as the donor molecules included in the photoelectric conversion layer 15, and zinc phthalocyanine is used as the donor molecules included in the photoelectric conversion layer 17. In this case, the amount of blue light can be detected by reading signal charge generated in the photoelectric conversion layer 15, and the amount of red light can be detected by reading signal charge generated in the photoelectric conversion layer 17.

At least one of the photoelectric conversion layer 15 or the photoelectric conversion layer 17 may include a plurality of types of donor molecule, not a single type of donor molecule. In this case, the spectral sensitivity characteristics of the photoelectric conversion layers 15 and 17 become different from each other by using different mixture ratios of the plurality of types of donor molecule.

Acceptor molecules are molecules whose lowest unoccupied molecular orbital (LUMO) is generally lower than that of donor molecules or whose highest occupied molecular orbital (HOMO) is higher than that of donor molecules. Molecules whose LUMO is lower than that of donor molecules tend to extract electrons. Molecules whose HOMO is higher than that of donor molecules tend to extract holes. The acceptor molecules are, for example, a fullerene (C60) or a fullerene derivative such as phenyl-C61-butyric acid methyl ester (PCBM) or bisphenyl-C60 ($CH_2SiMe_2Ph)_2$ (SIMEF).

At least one of the photoelectric conversion layer 15 or the photoelectric conversion layer 17 may be a microscopic mixture of donor molecules and acceptor molecules or have a multilayer structure. In addition, at least one of the photoelectric conversion layer 15 or the photoelectric conversion layer 17 may contain a material other than donor molecules and acceptor molecules. For example, at least one of the photoelectric conversion layer 15 or the photoelectric conversion layer 17 may include a polymer or the like for facilitating application of a semiconductor carbon nanotube.

3-3. Barrier Layer

The barrier layer 16 is located between the photoelectric conversion layers 15 and 17 and is an example of a first barrier layer that forms a first heterojunction barrier against the first signal charge in the photoelectric conversion layer 15. The barrier layer 16 does not form a heterojunction barrier against charge whose polarity is opposite that of the second signal charge in the photoelectric conversion layer 17. Alternatively, the barrier layer 16 may form a heterojunction barrier lower than the first heterojunction barrier against charge whose polarity is opposite that of the second signal charge. That is, the barrier layer 16 is a carrier selection layer that restricts movement of signal charge and that allows charge whose polarity is opposite that of the signal charge to move. Since the signal charge is holes in the present embodiment, the barrier layer 16 is a hole block layer that restricts movement of holes and that allows electrons to move. When the signal charge is electrons, the barrier layer 16 is an electron block layer that restricts movement of electrons and that allows holes to move. The hole block layer is to a layer that functions as a barrier effective only for holes. The electron block layer is a layer that functions as a barrier effective only for electrons.

Figure 3:
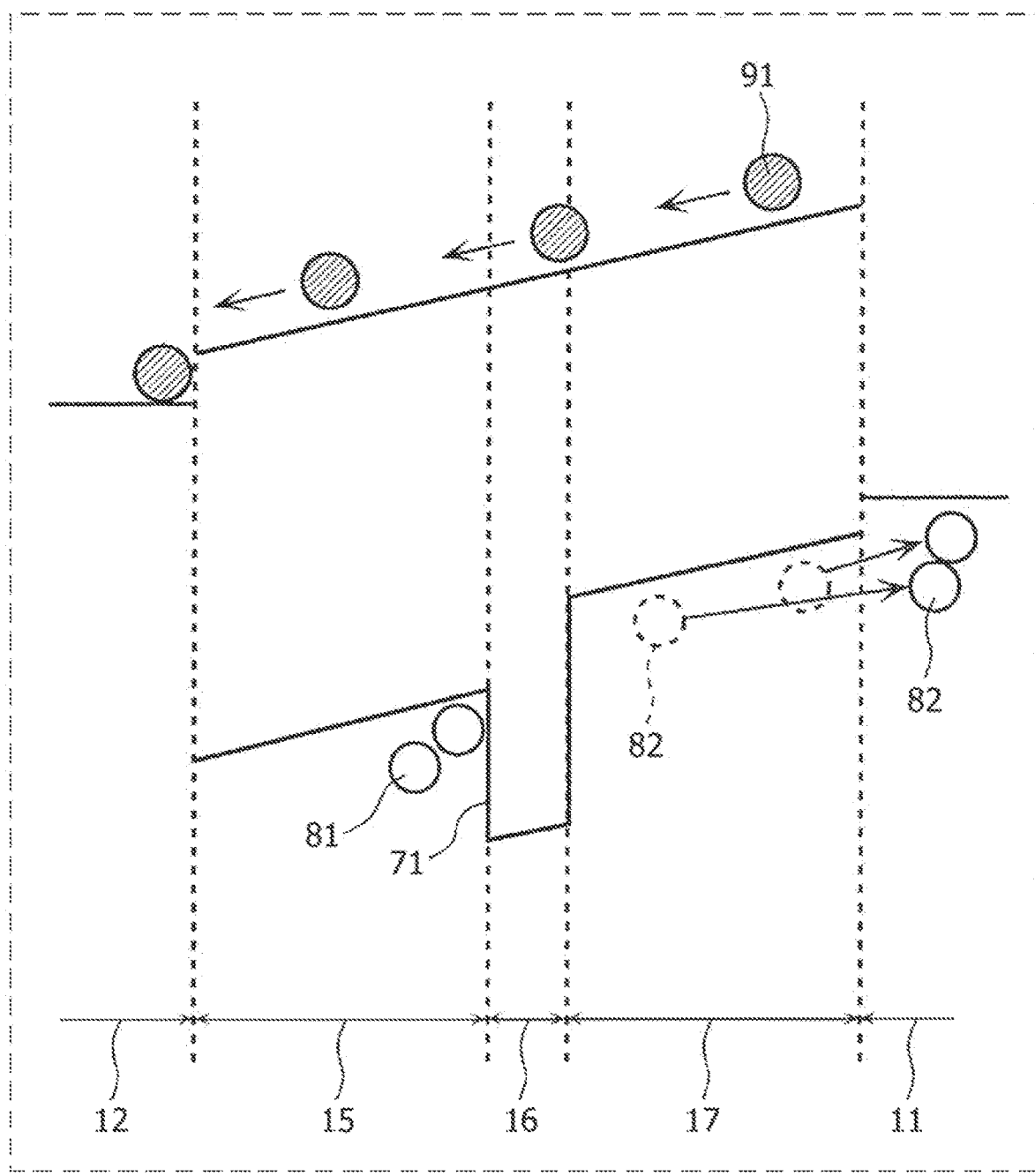
FIG. 3 is a schematic diagram illustrating energy levels during exposure in the imaging device according to the first embodiment.

FIG. 3 is a schematic diagram illustrating energy levels during exposure in the imaging device 100 according to the present embodiment. In FIG. 3, the potential difference between the pixel electrode 11 and the counter electrode 12 is a first potential difference.

When each layer is a mixture of a plurality of materials whose energy levels are different from one another in FIG. 3, an LUMO level or a conduction band level is a smallest value of LUMO levels or conduction levels of materials included in the mixture. Similarly, an HOMO level or a valence band level is a largest value of HOMO levels or valence band levels of materials included in the mixture. The same holds for other schematic diagrams about energy levels.

As illustrated in FIG. 3, the barrier layer 16 forms a heterojunction barrier 71, which is an example of the first heterojunction barrier. The heterojunction barrier 71 serves as a barrier when holes 81 collected by the pixel electrode 11 move from the photoelectric conversion layer 15 to the photoelectric conversion layer 17. At this time, the barrier layer 16 does not behave as a barrier when electrons 91 collected by the counter electrode 12 move from the photoelectric conversion layer 17 to the photoelectric conversion layer 15.

Such behavior that varies depending on the polarity of charge can be achieved by employing different barrier heights for holes and electrons. The "barrier height" refers to a difference between energy levels of a start point of moving charge and a heterojunction barrier. In the present embodiment, the start point is the photoelectric conversion layer 15 or 17 located over or under the barrier layer 16.

In the case of movement of holes, for example, the barrier height is a difference between energy levels of HOMO levels or valence band levels of a start point and a destination. In the case of movement of electrons, the barrier height is a difference between energy levels of LUMO levels or conduction band levels of a start point and a destination.

When an energy level of an LUMO level or a conduction band level of the barrier layer 16 is lower than or equal to an energy level of an LUMO level or a conduction band level of a start point and an energy level of an HOMO level or a valence band level of the barrier layer 16 is lower than an energy level of an HOMO level or a valence band level of the start point, for example, the barrier layer 16 behaves as a barrier against holes but does not behave as a barrier against electrons. In other words, the barrier layer 16 forms the heterojunction barrier 71 against holes and does not form a heterojunction barrier against electrons.

When the energy level of the LUMO level or the conduction band level of the barrier layer 16 is higher than the energy level of the LUMO level or the conduction band level of the start point and the energy level of the HOMO level or the valence band level of the barrier layer 16 is higher than or equal to the energy level of the HOMO level or the valence band level of the start point, for example, the barrier layer 16 behaves as a barrier against electrons but does not behave as a barrier against holes. In other words, the barrier layer 16 forms the heterojunction barrier 71 against electrons and does not form a heterojunction barrier against holes.

When the start point is a mixture of donor molecules and acceptor molecules, the energy level of the start point is considered on the basis of the polarity of charge in the donor molecules and the acceptor molecules. When the acceptor molecules extract holes from the donor molecules, for example, the HOMO level or the valence band level of the start point is based on an energy level of the acceptor molecules. In this case, the LUMO level or the conduction band level of the start point is based on an energy level of the donor molecules. When the acceptor molecules extract electrons from the donor molecules, on the other hand, the HOMO level or the valence band level of the start point is based on the energy level of the donor molecules. In this case, the LUMO level or the valence band level of the start point is based on the energy level of the acceptor molecules.

Since the barrier layer 16 according to the present embodiment forms the heterojunction barrier 71 against the holes 81 used as the signal charge, the holes 81 can be held in the photoelectric conversion layer 15. Even when the heterojunction barrier 71 is formed, however, the holes 81 pass through, that is, penetrate, the heterojunction barrier 71 with a certain probability due to a tunneling effect. A degree of the tunneling effect depends on the barrier height and thickness of the heterojunction barrier 71 and the bias voltage between the counter electrode 12 and the pixel electrode 11.

More specifically, as the barrier height of the heterojunction barrier 71 becomes smaller, as the heterojunction barrier 71 becomes thicker, and as the bias voltage becomes higher, the degree of the tunneling effect becomes higher, and the holes 81 are more likely to pass through the heterojunction barrier 71. The barrier height and thickness of the heterojunction barrier 71 are determined during fabrication depending on materials, composition ratios, and film thickness compositions of the photoelectric conversion layer 15, the barrier layer 16, and the photoelectric conversion layer 17. The bias voltage, on the other hand, can be freely changed. More specifically, the bias voltage can be changed in accordance with the voltage applied by the voltage supply circuit 32 to the counter electrode 12.

When the bias voltage between the counter electrode 12 and the pixel electrode 11 is set low, for example, the holes 81 collected by the pixel electrode 11 essentially do not pass through the heterojunction barrier 71 as illustrated in FIG. 3. That is, the holes 81 can be held in the photoelectric conversion layer 15.

Figure 4:
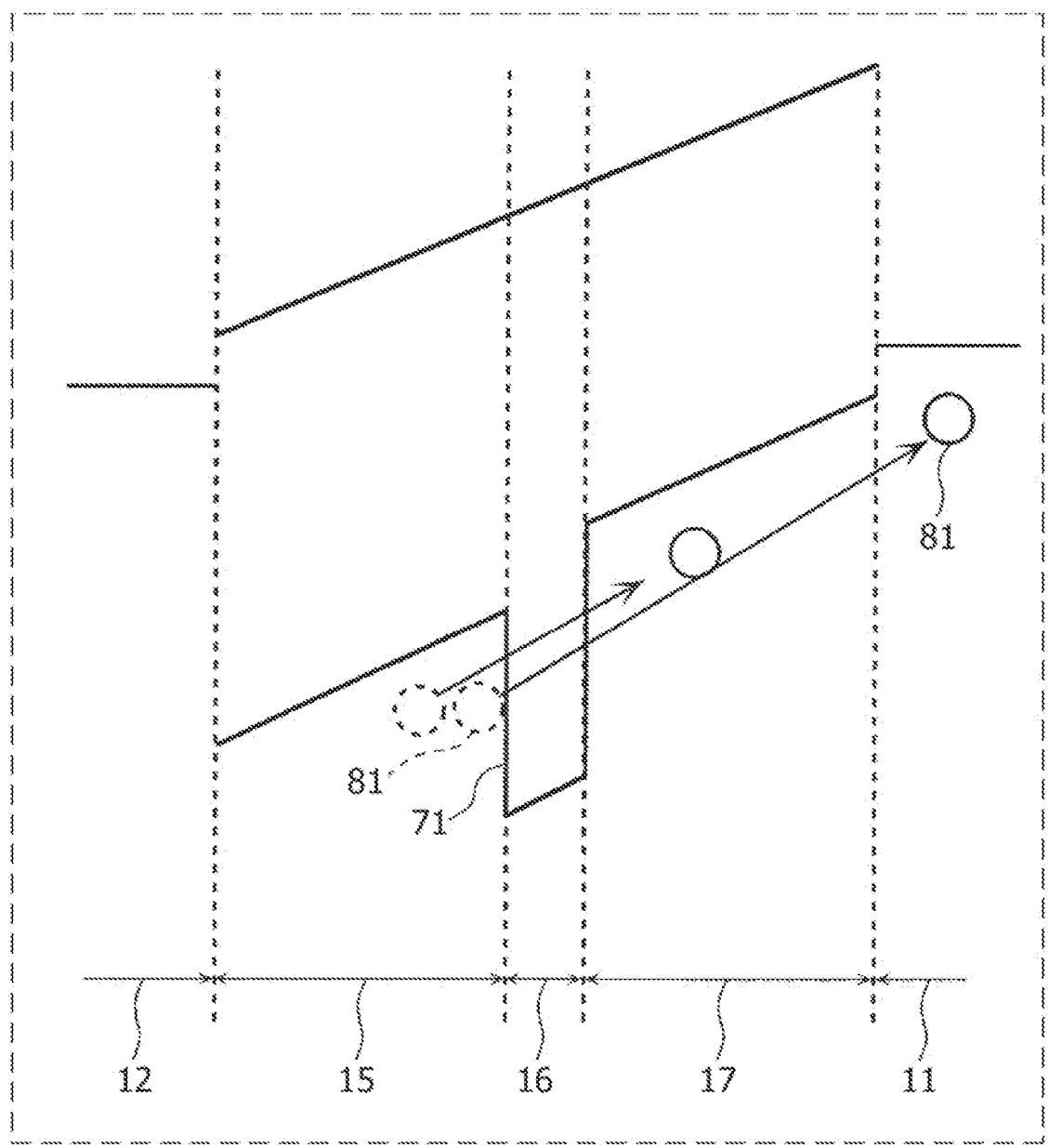
FIG. 4 is a schematic diagram illustrating energy levels during charge transfer in the imaging device according to the first embodiment.

When the bias voltage between the counter electrode 12 and the pixel electrode 11 is set high, on the other hand, the holes 81 collected by the pixel electrode 11 essentially pass through the heterojunction barrier 71 as illustrated in FIG. 4. "Essentially do not pass through" and "essentially pass through" mean that the percentage of penetration has a significant effect upon sensor characteristics under general use conditions of the imaging device 100.

FIG. 4 is a schematic diagram illustrating energy levels during charge transfer in the imaging device 100 according to the present embodiment.

In FIG. 4, the potential difference between the pixel electrode 11 and the counter electrode 12 is a second potential difference, which is larger than the first potential difference illustrated in FIG. 3. That is, in the example illustrated in FIG. 4, a bias voltage higher than in FIG. 3 is applied between the counter electrode 12 and the pixel electrode 11. In this case, as illustrated in FIG. 4, the holes 81 held in the photoelectric conversion layer 15 by the heterojunction barrier 71 pass through the heterojunction barrier 71 and are collected by the pixel electrode 11 via the photoelectric conversion layer 17.

Here, a bias voltage at which the holes 81 begins to essentially pass through the heterojunction barrier 71 will be referred to as a "threshold bias voltage". The threshold bias voltage is determined on the basis of the barrier height and thickness of the heterojunction barrier 71, the thickness of the photoelectric conversion layers 15 and 17, and the like. The threshold bias voltage can be obtained through an experiment or calculated using quantum mechanics. Changing of barrier penetrability based on bias voltage is a technique widely used in devices such as flash memories, and a technique for designing a threshold bias voltage has been established.

The thickness of the heterojunction barrier 71 is equal to the film thickness of the barrier layer 16. The film thickness of the barrier layer 16 is set such that the threshold bias voltage falls within a range of voltage suppliable by the voltage supply circuit 32. The film thickness of the barrier layer 16 varies depending on settable values of the bias voltage, the barrier height of the heterojunction barrier 71, and the thickness of the photoelectric conversion layer, for example, but is generally several nanometers to tens of nanometers. The barrier height of the heterojunction barrier 71 is, for example, greater than or equal to 0.5 eV. The barrier height of the heterojunction barrier 71 may be 1 eV or more, instead.

As described above, in the configuration in which the pixel electrode 11 collects the holes 81 as signal charge, the barrier layer 16 is a hole block layer. More specifically, when the acceptor molecules of the photoelectric conversion layer 15 extract the holes 81, the heterojunction barrier 71 against the holes 81 can be formed by making the HOMO of the barrier layer 16 deeper than that of the acceptor molecules of the photoelectric conversion layer 15. In addition, when the acceptor molecules of the photoelectric conversion layer 15 extract the electrons 91, the heterojunction barrier against the holes 81 can be formed by making the HOMO of the barrier layer 16 deeper than that of the donor molecules of the photoelectric conversion layer 15.

As described above, the barrier layer 16 need not form a heterojunction barrier against the electrons 91 that move from the photoelectric conversion layer 17 to the photoelectric conversion layer 15, or a heterojunction barrier lower than the heterojunction barrier 71 against the holes 81 may be formed. More specifically, when the acceptor molecules of the photoelectric conversion layer 17 extract holes 82, the LUMO of the barrier layer 16 is equal to the LUMO of the donor molecules of the photoelectric conversion layer 17. When the acceptor molecules of the photoelectric conversion layer 17 extract the electrons 91, on the other hand, the LUMO of the barrier layer 16 is equal to the LUMO of the acceptor molecules of the photoelectric conversion layer 17.

Examples of a material contained in the barrier layer 16 that functions as a hole block layer include a fullerene (C60) and a fullerene derivative such as phenyl-C61-butyric acid methyl ester (PCBM).

When the pixel electrode 11 collects the electrons 91 as signal charge, the barrier layer 16 is an electron block layer. More specifically, when the acceptor molecules of the photoelectric conversion layer 15 extract the holes 81, the heterojunction barrier against the electrons 91 can be formed by making the LUMO of the barrier layer 16 shallower than that of the donor molecules of the photoelectric conversion layer 15. When the acceptor molecules of the photoelectric conversion layer 15 extract the electrons 91, on the other hand, the heterojunction barrier against the electrons 91 can be formed by making the LUMO of the barrier layer 16 shallower than that of the LUMO of the acceptor molecules of the photoelectric conversion layer 15.

The barrier layer 16 does not form a heterojunction barrier against the holes 82 that move from the photoelectric conversion layer 17 to the photoelectric conversion layer 15, or a heterojunction barrier lower than the heterojunction barrier against the electrons 91 may be formed. More specifically, when the acceptor molecules of the photoelectric conversion layer 17 extract the holes 82, the HOMO of the barrier layer 16 is equal to that of the acceptor molecules of the photoelectric conversion layer 17. Alternatively, when the acceptor molecules of the photoelectric conversion layer 17 extract electrons, the HOMO of the barrier layer 16 is equal to that of the donor molecules of the photoelectric conversion layer 17. Alternatively, when the acceptor molecules of the photoelectric conversion layer 17 extract electrons, the HOMO of the barrier layer 16 is equal to that of the donor molecules of the photoelectric conversion layer 17.

Examples of a material contained in the barrier layer 16 that functions as an electron block layer include PEDOT: PSS, which is a complex composed of poly(3,4-ethylenedioxythiophene) (PEDOT) and polystyrene sulfonate (PSS), N4,N4'-Di(naphthalen-1-yl)-N4,N4'-bis(4-vinylphenyl)biphenyl-4,4'-diamine (VNPB), poly(3-hexylthiophene-2,5-diyl) (P3HT), and a graphene oxide.

The material contained in the barrier layer 16 is not limited to the above examples. For example, the barrier layer 16 may contain an organic semiconductor material or a carbon nanotube. The barrier layer 16 is transparent to at least a part of a wavelength band absorbed by the photoelectric conversion layer 17.

4. Driving Method

Next, a method for driving the imaging device 100 according to the present embodiment will be described. Although a case where the pixel electrode 11 collects the holes 81 and 82 as signal charge will be described hereinafter, it is obvious to those skilled in the art that the same operation can be performed to collect the electrons 91 by changing polarity as necessary.

Figure 5:
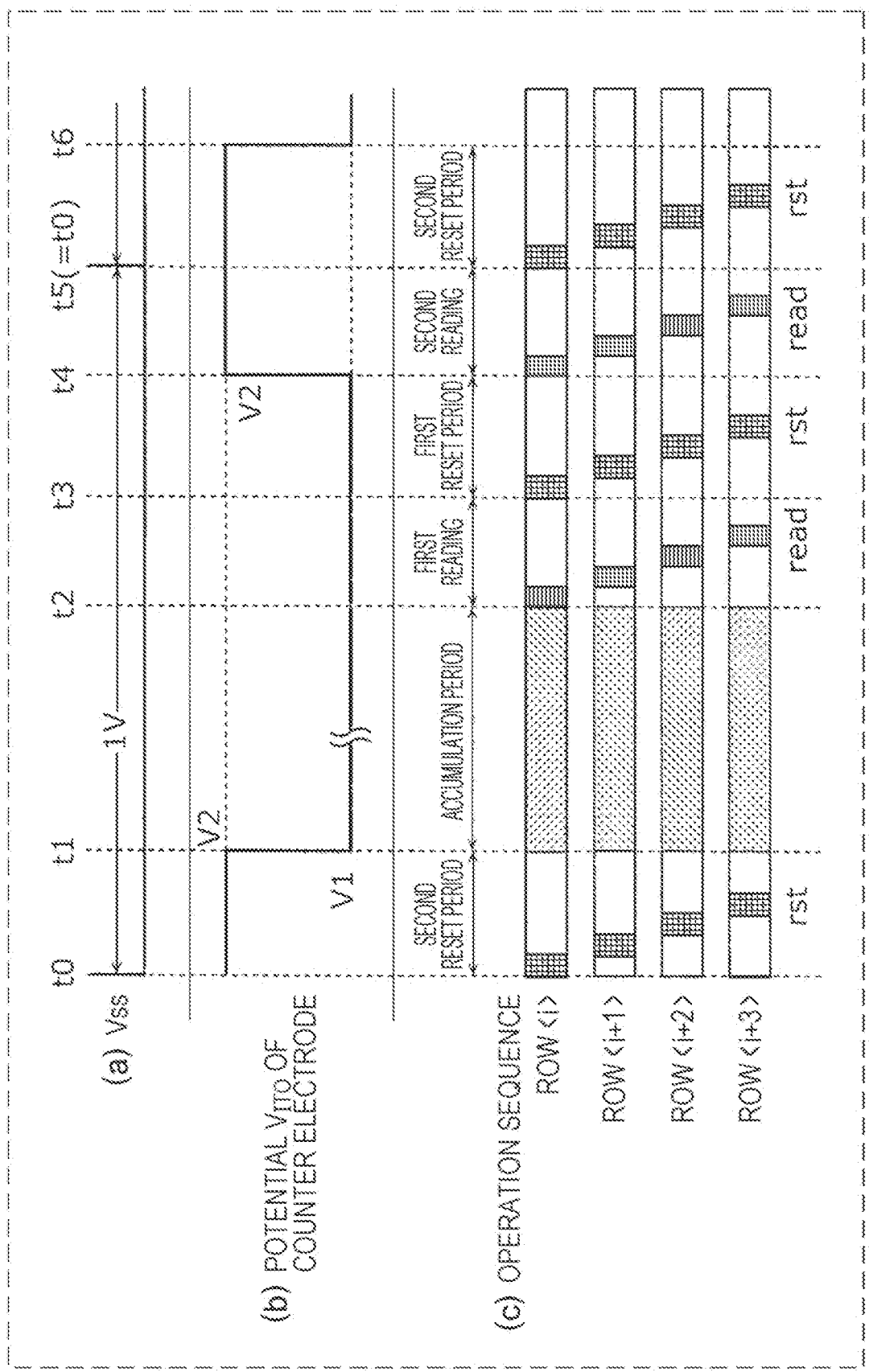
FIG. 5 is a timing chart illustrating an example of a method for driving the imaging device according to the first embodiment.

FIG. 5 is a timing chart illustrating the method for driving the imaging device 100 according to the present embodiment. More specifically, portion (a) of FIG. 5 illustrates rising and falling timings of a vertical synchronization signal Vss. Portion (b) of FIG. 5 illustrates an example of temporal changes in a potential $V_{ITO}$ applied by the voltage supply circuit 32 to the counter electrode 12 via the bias control line 42. Portion (c) of FIG. 5 schematically illustrates reset and exposure timings in each of the rows of the pixel array PA.

An example of an operation performed by the imaging device 100 will be described hereinafter with reference to FIGS. 1 to 5. An example of an operation in a case where the number of rows of pixels included in the pixel array PA is a total of four, namely rows <i> to <i+3>, will be described for the sake of simplicity.

As illustrated in portion (c) of FIG. 5, in the imaging device 100 according to the present embodiment, initialization of the pixel array PA and exposure of the pixel array PA, that is, accumulation of charge, resetting of the charge accumulation node 41 of each of the pixels 10 included in the pixel array PA, and reading of pixel signals after the resetting are performed. The initialization of the pixel array PA is essentially the same as the resetting of the charge accumulation nodes 41.

In portion (c) of FIG. 5, rectangular areas named "read" schematically indicate reading periods of signals. Rectangular areas named "rst" schematically indicate reset periods of signals. The reading periods can each include a reset period, in which the potential of the charge accumulation nodes 41 of the pixels 10 is reset.

In the resetting of the pixels 10 in the row <i>, the vertical scanning circuit 36 controls the potential of the address control line 46 in the row <i> in such a way as to turn on the address transistors 26 whose gates are connected to the address control line 46. Furthermore, the vertical scanning circuit 36 controls the potential of the reset control line 48 in the row <i> in such a way as to turn on the reset transistors 28 whose gates are connected to the reset control line 48. As a result, the charge accumulation nodes 41 and the reset voltage lines 44 are electrically connected to each other, and the reset voltage Vr is supplied to the charge accumulation nodes 41. That is, the potential of the gate electrodes 24g of the signal detection transistors 24 and the pixel electrodes 11 of the photoelectric conversion units 13 are reset to the reset voltage Vr. Pixel signals after the resetting are then read from the pixels 10 in the row <i> via the vertical signal lines 47. The pixel signals obtained at this time correspond to the reset voltage Vr. After the pixel signals are read, the reset transistors 28 and the address transistors 26 are turned off.

As schematically illustrated in portion (c) of FIG. 5, the pixels 10 in the rows <i> to <i+3> are sequentially reset in units of rows in this example. As illustrated in portion (b) of FIG. 5, the voltage supply circuit 32 applies control voltage to the counter electrode 12 in a vertical period 1V, which is a period from a beginning of obtaining of an image to an end of the resetting and the reading of pixel signals in all the rows of the pixel array PA, such that the potential difference between the pixel electrode 11 and the counter electrode 12 switches between V1 and V2 so that the tunneling effect is controlled.

Although FIG. 5 illustrates only the voltage applied to the counter electrode 12 for the sake of simplicity, the tunneling effect of the holes 81 may be controlled, instead, by controlling the potential of the pixel electrode 11, that is, the reset voltage Vr, in first and second reset periods illustrated in FIG. 5. Alternatively, the tunneling effect may be controlled by appropriately changing a combination of the potential $V_{ITO}$ of the counter electrode 12 and the reset voltage Vr.

A specific operation sequence of the imaging device 100 is as follows.

Step S0: Initialization (Time t0 to Time t1)

First, signal charge in all the photoelectric conversion layers 15 and 17 and the charge accumulation nodes 41 is eliminated. That is, from a time t0 to a time t1, all the photoelectric conversion layers 15 and 17 and the charge accumulation regions are reset in a state in which all the photoelectric conversion layers 15 and 17 and the pixel electrodes 11 are connected to one another through tunneling.

As illustrated in FIG. 5, for example, resetting of the pixels in the row <i> starts on the basis of the vertical synchronization signal Vss (time t0). More specifically, the bias voltage between each counter electrode 12 and the corresponding pixel electrode 11 is set to a value larger than or equal to a threshold voltage for the heterojunction barrier 71 such that the potential of the counter electrode 12 becomes higher than that of the pixel electrode 11. That is, the potential $V_{ITO}$ of the counter electrode 12 is set to V2 so that the potential difference between the pixel electrode 11 and the counter electrode 12 becomes the second potential difference, at which the holes 81 can pass through the heterojunction barrier 71 due to a tunneling effect. After all the photoelectric conversion layers 15 and 17 and the charge accumulation regions are reset, initial values of the potential of the charge accumulation regions may be measured.

Step S1: Exposure (Time t1 to Time t2)

Next, the potential V1, at which the photoelectric conversion layers 15 and 17 can perform photoelectric conversion, is applied to the counter electrode 12 to start the charge accumulation period (from the time t1 to a time t2). Light is radiated onto the imaging device 100 in this state. At this time, signal charge is generated in the photoelectric conversion layer 15 and/or the photoelectric conversion layer 17. A step of generating signal charge in the photoelectric conversion layers 15 and 17 through radiation of light will be referred to as "exposure". The amount of signal charge generated in each of the photoelectric conversion layers 15 and 17 depends on the spectrum of the light radiated and the spectral sensitivity characteristics of the photoelectric conversion layer.

Since the potential of the counter electrode 12 is higher than that of the pixel electrode 11, movement of charge illustrated in FIG. 3 occurs. More specifically, the holes 82 generated in the photoelectric conversion layer 17 move toward the pixel electrode 11, are collected by the pixel electrode 11, are transported to the charge accumulation node 41, and are accumulated. The electron 91 generated in the photoelectric conversion layer 17 move toward the counter electrode 12. At this time, the barrier layer 16 does not behave as a barrier against the electrons 91. The electrons 91, therefore, penetrate the barrier layer 16 and are collected by the counter electrode 12 via the photoelectric conversion layer 15.

The holes 81 generated in the photoelectric conversion layer 15 move toward the pixel electrode 11. The heterojunction barrier 71 formed by the barrier layer 16, however, behaves as a barrier against the holes 81. Since the potential difference between the pixel electrode 11 and the counter electrode 12 is the first potential difference, which is smaller than or equal to the threshold bias voltage, the holes 81 do not pass through the heterojunction barrier 71. The holes 81 generated in the photoelectric conversion layer 15, therefore, are held in the photoelectric conversion layer 15.

The electrons 91 generated in the photoelectric conversion layer 15 move toward the counter electrode 12 and are collected by the counter electrode 12.

Step S2: First Charge Reading (Time t2 to Time t3)

After the exposure is completed, the holes 82, which are signal charge generated in the photoelectric conversion layer 17, are accumulated in the charge accumulation node 41. The signal detection circuit 14, therefore, measures the amount of charge accumulated in the charge accumulation node 41. The amount of charge accumulated in the charge accumulation node 41 is equal to the amount of signal charge generated in the photoelectric conversion layer 17.

More specifically, as illustrated in portion (c) of FIG. 5, charge is sequentially read from the row <i> through a rolling operation. Time taken for the rolling operation to complete can be reduced by using a chip stacking technique by which a reading circuit and a photoelectric conversion unit are stacked on each other or separately providing a memory in each of the pixels 10.

Step S3: First Charge Resetting (Time t3 to Time t4)

After the first charge reading is completed, the signal charge accumulated in the charge accumulation node 41 is eliminated. As illustrated in portion (b) of FIG. 5, the potential $V_{ITO}$ of the counter electrode 12 is kept at V1 from the time t2 to the time t4, during which the first charge reading and the first resetting are performed. That is, the holes 81 generated in the photoelectric conversion layer 15 do not pass through the heterojunction barrier 71 and are held in the photoelectric conversion layer 15.

Step S4: Charge Transfer (Time t4)

After the first charge resetting is completed, the bias voltage between the counter electrode 12 and the pixel electrode 11 is set to a value larger than or equal to the threshold bias voltage. More specifically, as illustrated in portion (b) of FIG. 5, the potential $V_{ITO}$ of the counter electrode 12 is set to V2 at the time t4 so that the potential difference between the counter electrode 12 and the pixel electrode 11 becomes the second potential difference. By applying the bias voltage, the holes 81 accumulated in the photoelectric conversion layer 15 pass through the heterojunction barrier 71 due to a tunneling effect, move to the photoelectric conversion layer 17 due to potential gradient, are collected by the pixel electrode 11, and are accumulated in the charge accumulation node 41 as illustrated in FIG. 4.

Step S5: Second Charge Reading (Time t4 to Time t5)

When the charge transfer is completed, the holes 81 generated in the photoelectric conversion layer 15 have been accumulated in the charge accumulation node 41. The signal detection circuit 14, therefore, measures the amount of charge accumulated in the charge accumulation node 41. The amount of charge accumulated in the charge accumulation node 41 is equal to the amount of signal charge generated in the photoelectric conversion layer 15. More specifically, as illustrated in portion (c) of FIG. 5, charge is sequentially read from the row <i> through a rolling operation. The reading operation is the same as in the first charge reading (step S2).

Step S6: Second Charge Resetting (Time t5 to Time t6)

After the second charge reading is completed, the signal charge accumulated in the charge accumulation nodes 41 is eliminated. As a result, the photoelectric conversion layers 15 and 17 and the charge accumulation nodes 41 are reset, and the pixel array PA are initialized. That is, the state at the time t1 is established again at a time t6. A moving image can be obtained by repeating steps S1 to S6.

Signal charge generated in the photoelectric conversion layers 15 and 17 can thus be separately read using the above procedure.

When the spectral sensitivity characteristics of the photoelectric conversion layers 15 and 17 are different from each other, therefore, an image can be captured with two different spectra in each pixel. In addition, since different materials may be used for the photoelectric conversion layers 15 and 17 in the present embodiment, the spectral sensitivity characteristics of the photoelectric conversion layers 15 and 17 can be optimized. In addition, since the reading is performed in each of the photoelectric conversion layers 15 and 17, wiring and independent electrodes for the reading need not be provided for each of the photoelectric conversion layers 15 and 17. In step S2 and later, the radiation of light onto the imaging device 100 may be restricted using a mechanism such as a mechanical shutter, instead, in order to avoid unnecessary photoelectric conversion.

In the driving method illustrated in FIG. 5, an accumulation period does not perfectly match between the photoelectric conversion layers 15 and 17. More specifically, an accumulation period of the photoelectric conversion layer 17 is essentially from the time t1 to an end of a first reading period. An accumulation period of the photoelectric conversion layer 15 is from the time t1 to an end of a second reading period. This difference between the accumulation periods is substantially negligible when the reading is performed with a high-speed rolling operation.

Figure 6:
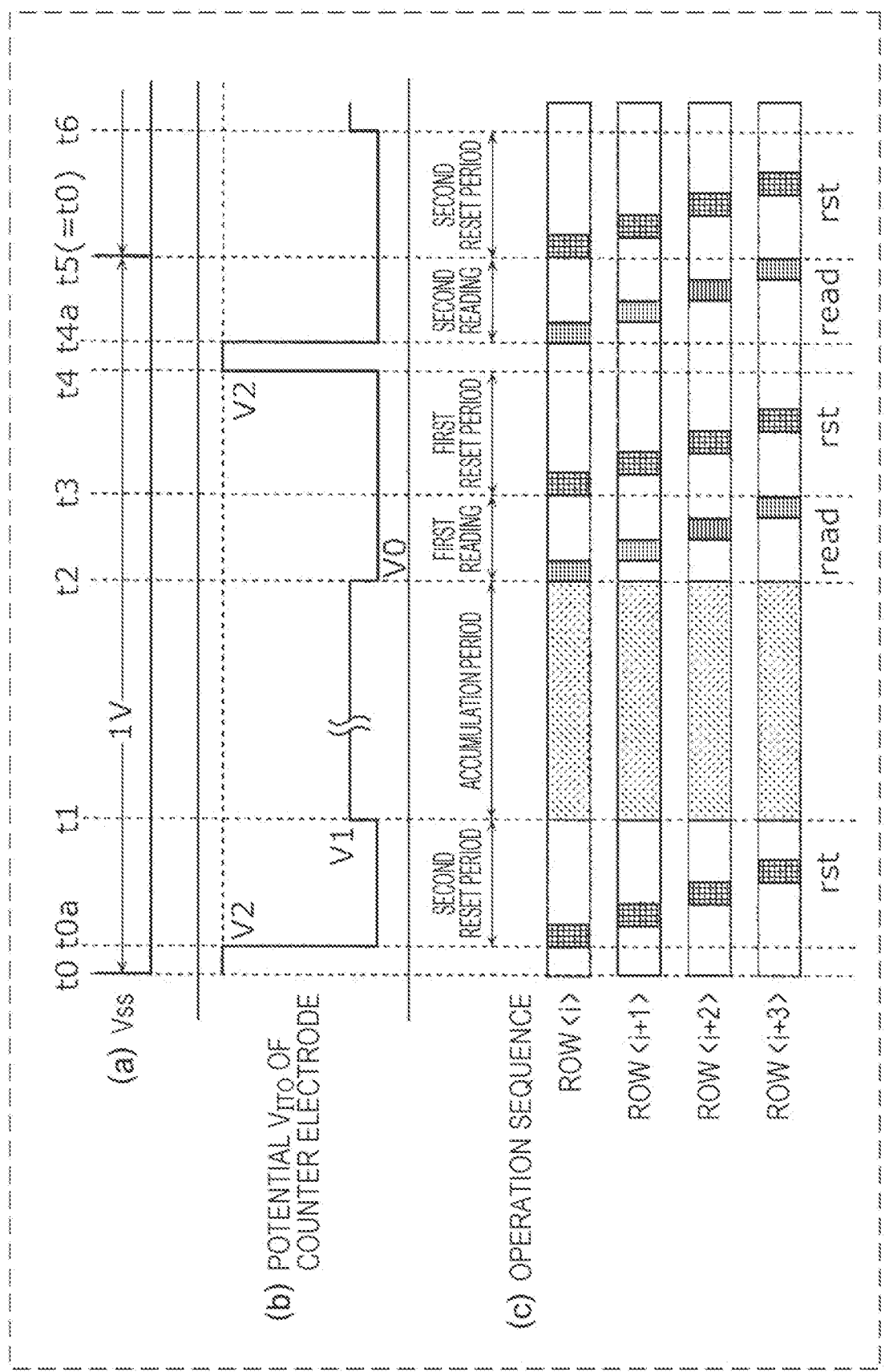
FIG. 6 is a timing chart illustrating another example of the method for driving the imaging device according to the first embodiment.

Alternatively, the imaging device 100 may be driven on the basis of an operation illustrated in FIG. 6. FIG. 6 is a timing chart illustrating another example of the method for driving the imaging device 100 according to the present embodiment. In the example illustrated in FIG. 6, after charge is transferred to the charge accumulation node 41 from the photoelectric conversion layers 15 and 17, the sensitivity of the photoelectric conversion layers 15 and 17 becomes zero, that is, the photoelectric conversion layers 15 and 17 enter a global shutter state. The reading and resetting of the charge transferred to the charge accumulation node 41 are performed in the global shutter state. In the global shutter state, signal charge is not newly generated in the photoelectric conversion layers 15 and 17.

From the time t2 to the time t4, for example, the potential $V_{ITO}$ of the counter electrode 12 is set to a potential V0, at which the sensitivity of the photoelectric conversion layers 15 and 17 becomes zero. At the potential V0, for example, the potential difference between the counter electrode 12 and the pixel electrode 11 becomes zero. As a result, an effect of the exposure during the reading periods and the reset periods due to the rolling operation is reduced.

In the example illustrated in FIG. 6, the global shutter state is established from a time t0a to the time t1, from the time t2 to the time t4, and from a time t4a to the time t6. A period for transferring signal charge to the charge accumulation node 41 from the photoelectric conversion layers 15 and 17 is provided immediately before the time t0a and the time t4a.

A period from the time t0 to the time t0a, for example, is a period for transferring charge remaining in the photoelectric conversion layers 15 and 17 to the charge accumulation node 41 for the initialization. In the period from the time t0 to the time t0a, the potential $V_{ITO}$ of the counter electrode 12 is V2 as illustrated in portion (b) of FIG. 6. As a result, the signal charge remaining in the photoelectric conversion layer 15 passes through the heterojunction barrier 71 and is transferred to the charge accumulation node 41. The signal charge remaining in the photoelectric conversion layer 17 is also transferred to the charge accumulation node 41.

Similarly, a period from the time t4 to the time t4a is a period for transferring the holes 81 held in the photoelectric conversion layer 15. As illustrated in portion (b) of FIG. 6, the potential $V_{ITO}$ of the counter electrode 12 is V2. As a result, the holes 81 generated in the photoelectric conversion layer 15 pass through the heterojunction barrier 71 and are transferred to the charge accumulation node 41.

Signal charge to be read is thus transferred to the charge accumulation node 41 immediately before the global shutter state is established. The reading and the resetting are then performed in the global shutter state. The period from the time t0 to the time t0a and the period from the time t4 to the time t4a, in which charge is transferred, are shorter than a period for which the global shutter state remains established. An effect produced by the difference between essential lengths of the exposure periods of the photoelectric conversion layers 15 and 17, therefore, can be reduced.

Although signal charge in the photoelectric conversion layers 15 and 17 is sequentially read in the present embodiment, signal charge in the photoelectric conversion layers 15 and 17 may be read at once. In FIGS. 5 and 6, for example, if the first reset period from the time t3 to the time t4 is omitted, the total amount of signal charge generated in the photoelectric conversion layers 15 and 17 can be read in a period from the time t4 to the time t6. The amount of signal charge in each of the photoelectric conversion layers 15 and 17 may be calculated in an analog domain or a digital domain using differential circuits provided outside the pixels 10. As a result, the reading periods can be reduced.

In the reset periods, a simultaneous reset operation, in which all pixels are simultaneously reset, may be performed instead of the rolling operation illustrated in FIGS. 5 and 6. In doing so, the reset periods can be reduced. Since signal charge in the photoelectric conversion layers 15 and 17 is read, the number of times of resetting is larger than in the case of a common single-layer sensor or a silicon sensor. An effect of reducing time produced by the simultaneous reset operation is especially great.

In the present embodiment, signal charge need not be transferred via transfer transistors. In addition, the photoelectric conversion layers 15 and 17 need not be isolated from each other by a transparent electrode and plugs need not be pull out from the photoelectric conversion layers 15 and 17. Since charge can be transferred and sensitivity can be changed by controlling the voltage $V_{ITO}$, operation can be performed at higher speed. In addition, since a transfer transistor need not be separately provided for each of the pixels 10, the pixels 10 are reduced in size.

5. Spectral Sensitivity Characteristics of Photoelectric Conversion Layers

As described above, with the imaging device 100 according to the present embodiment, signal charge in the photoelectric conversion layers 15 and 17 can be separately read. Imaging based on different spectra can be performed by using different spectral sensitivity characteristics for the photoelectric conversion layers 15 and 17. More specifically, the imaging device 100 according to the present embodiment can perform imaging based on two different spectra with a single pixel 10.

Figure 7:
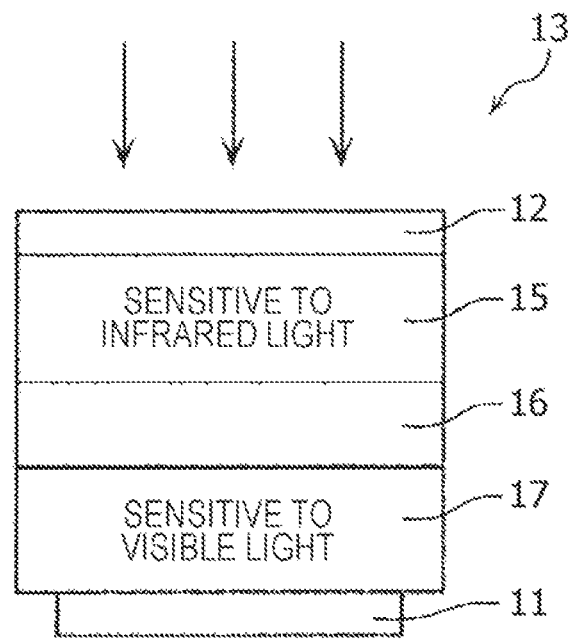
FIG. 7 is a diagram illustrating an example of a combination of spectral sensitivity characteristics of photoelectric conversion layers of a photoelectric conversion unit of the imaging device according to the first embodiment.

FIG. 7 is a diagram illustrating an example of a combination of spectral sensitivity characteristics of the photoelectric conversion layers 15 and 17 of the photoelectric conversion unit 13 of the imaging device 100 according to the present embodiment. In the present embodiment, as illustrated in FIG. 7, the photoelectric conversion layer 15 on a side of the counter electrode 12, on which light is incident, is sensitive to infrared light, and the photoelectric conversion layer 17 on a side of the pixel electrode 11 is sensitive to visible light. In this case, as described hereinafter, an effect of reducing noise caused by thermal charge can be produced.

In the photoelectric conversion layers 15 and 17, thermal charge, which is caused through thermal excitation, exists as well as photo-charge, which is caused through light radiation. Despite a difference in a cause of occurrence, thermal charge and photo-charge are the same charge and not distinguished from each other when accumulated in the charge accumulation node 41. Thermal charge, therefore, causes noise.

In general, donor molecules having absorbance at longer wavelengths cause more thermal charge. For example, donor molecules having absorbance in an infrared range cause more thermal charge than ones having absorbance in a visible range or an ultraviolet range.

When donor molecules having absorbance in the infrared range are added to a photoelectric conversion layer for visible light in order for the photoelectric conversion layer to be sensitive in the infrared range, or when a photoelectric conversion layer composed of donor molecules having absorbance in the infrared range is added, more noise is caused than in an image sensor dedicated for the visible range. In a conventional image sensor, therefore, it is difficult to simultaneously achieve imaging with a high S/N ratio in the visible range and long wavelength sensitivity.

In the imaging device 100 according to the present embodiment, on the other hand, the photoelectric conversion layer 17 is a layer that is sensitive to visible light and in which little thermal noise is caused, and the photoelectric conversion layer 15 is a layer that is sensitive to infrared light and in which much thermal noise is caused as illustrated in FIG. 7. As a result, only charge in the photoelectric conversion layer 17, in which little thermal charge is caused, is read in the first charge reading. Since the thermal charge generated in the photoelectric conversion layer 15 is held in the photoelectric conversion layer 15 because of the heterojunction barrier 71 at this time, the thermal charge does not affect the reading of the signal charge generated in the photoelectric conversion layer 17. An image obtained on the basis of visible light, therefore, is an image with a high S/N ratio little affected by thermal noise. With the imaging device 100 according to the present embodiment, imaging with a high S/N ratio in the visible range and long wavelength sensitivity can thus be simultaneously achieved.

Figure 8:
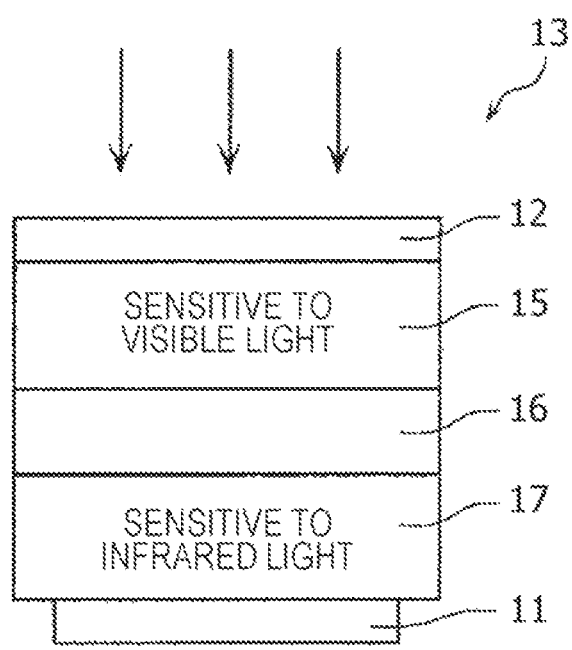
FIG. 8 is a diagram illustrating another example of the combination of spectral sensitivity characteristics of the photoelectric conversion layers of the photoelectric conversion unit of the imaging device according to the first embodiment.

Alternatively, as illustrated in FIG. 8, the photoelectric conversion layer 15 on the side of the counter electrode 12, on which light is incident, may be sensitive to visible light, and the photoelectric conversion layer 17 on the side of the pixel electrode 11 may be sensitive to infrared light. In this case, light receiving sensitivity increases for visible light. FIG. 8 is a diagram illustrating another example of the combination of spectral sensitivity characteristics of the photoelectric conversion layers 15 and 17 of the photoelectric conversion unit 13 of the imaging device 100 according to the present embodiment.

Figure 9:
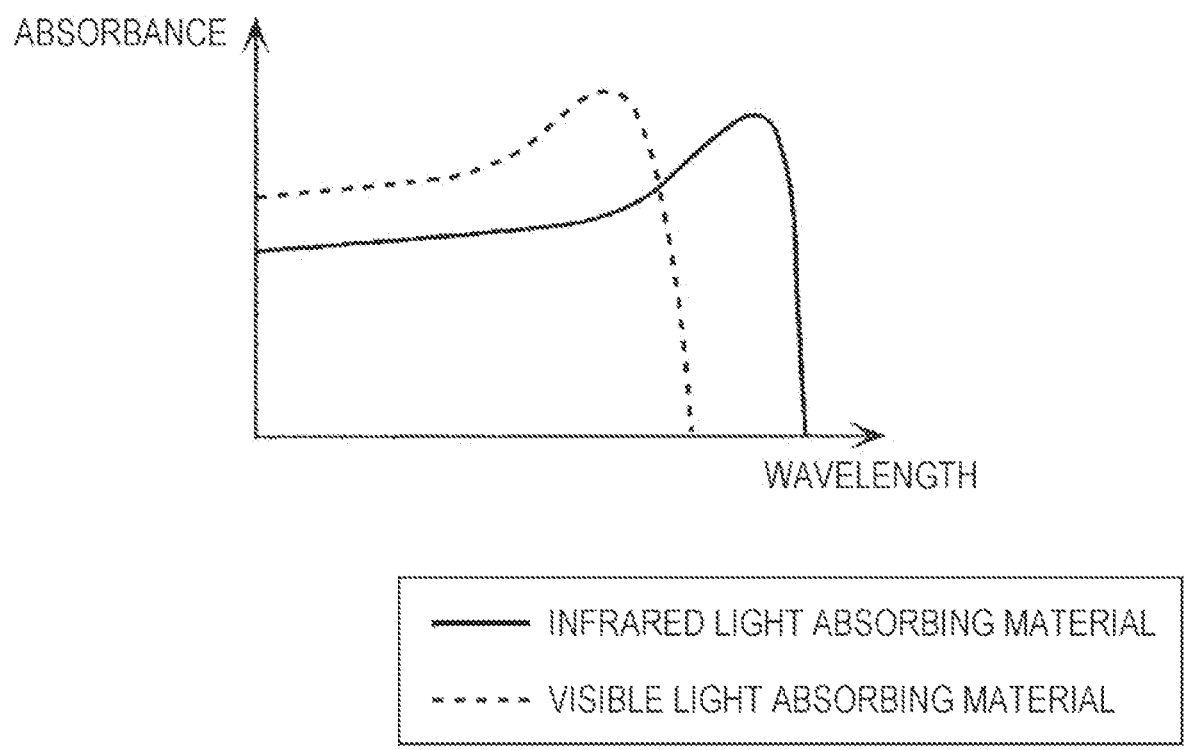
FIG. 9 is a diagram schematically illustrating spectral sensitivity characteristics of an infrared light absorbing material and a visible light absorbing material used for the photoelectric conversion layers in the imaging device according to the first embodiment.

FIG. 9 is a diagram schematically illustrating spectral sensitivity characteristics of an infrared light absorbing material and a visible light absorbing material used for the photoelectric conversion layers 15 and 17 in the imaging device 100 according to the present embodiment. As illustrated in FIG. 9, the infrared light absorbing material not only has a certain of absorbance in the infrared range but also absorbs visible light to some degree. When a photoelectric conversion layer composed of the infrared light absorbing material is located closer to a side on which light is incident than a photoelectric conversion layer that absorbs visible light is, the former photoelectric conversion layer undesirably absorbs a part of visible light, and sensitivity to visible light decreases.

In the example illustrated in FIG. 8, on the other hand, the photoelectric conversion layer 15 on the side on which light is incident is sensitive to visible light and can generate signal charge according to the intensity of visible light before an infrared light absorbing material absorbs light. With the imaging device 100 illustrated in FIG. 8, therefore, a decrease in sensitivity to visible light is suppressed.

As described above, the present embodiment have advantages in both the examples illustrated in FIGS. 7 and 8. A desired configuration may be selected in accordance with a use environment and required performance of the imaging device 100.

Second Embodiment

Next, a second embodiment will be described. The second embodiment is different from the first embodiment in that a photoelectric conversion unit includes three photoelectric conversion layers. Differences from the first embodiment will be mainly described hereinafter, and description of common features is omitted or simplified.

1. Structure

Figure 10:
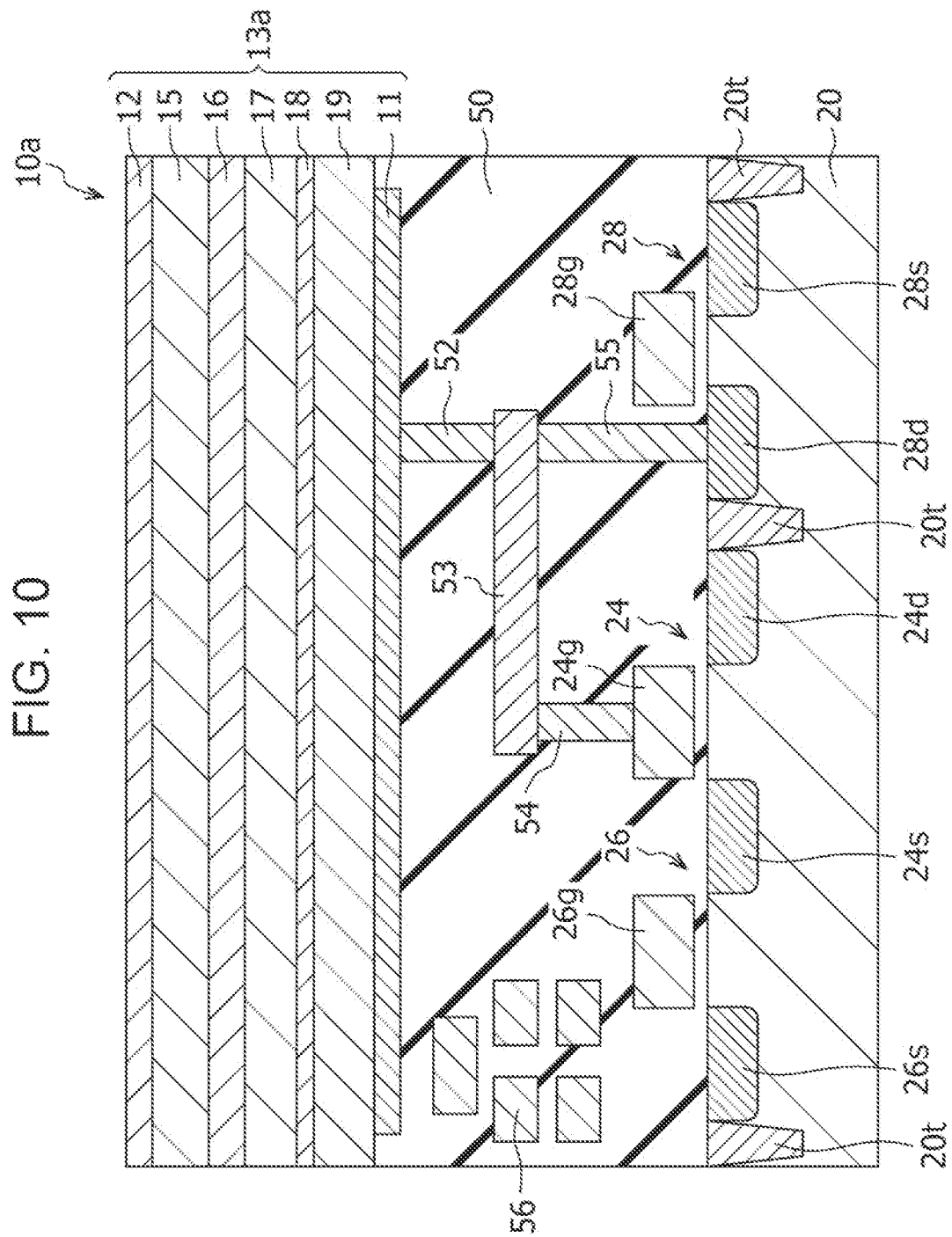
FIG. 10 is a schematic cross-sectional view of the cross-sectional structure of one of pixels of an imaging device according to a second embodiment.

FIG. 10 is a schematic cross-sectional view of the cross-sectional structure of one of pixels of the imaging device 100 according to the present embodiment. As illustrated in FIG. 10, a pixel 10a of the imaging device 100 is different from the pixel 10 according to the first embodiment in that the pixel 10a includes a photoelectric conversion unit 13a instead of the photoelectric conversion unit 13.

The photoelectric conversion unit 13a includes the pixel electrode 11, the counter electrode 12, and the photoelectric conversion layer 15, the barrier layer 16, the photoelectric conversion layer 17, a barrier layer 18, and a photoelectric conversion layer 19 provided between the pixel electrode 11 and the counter electrode 12. More specifically, the counter electrode 12, the photoelectric conversion layer 15, the barrier layer 16, the photoelectric conversion layer 17, the barrier layer 18, the photoelectric conversion layer 19, and the pixel electrode 11 are arranged in this order from a side of the imaging device 100 on which light is incident.

The photoelectric conversion layer 19 is located between the photoelectric conversion layer 17 and the pixel electrode 11 and is an example of a third photoelectric conversion layer that generates third signal charge. The photoelectric conversion layer 19 is the same as the photoelectric conversion layers 15 and 17 according to the first embodiment in that the photoelectric conversion layer 19 has a function of absorbing photons and generating photo-charge. Materials that can be used for the photoelectric conversion layer 19, too, may be the same as for the photoelectric conversion layers 15 and 17 as described in the first embodiment. Spectral sensitivity characteristics of the photoelectric conversion layers 15, 17, and 19 may be changed by using different types of material for donor molecules or different mixture ratios. That is, in the present embodiment, the photoelectric conversion layers 15, 17, and 19 have different spectral sensitivity characteristics. For example, the photoelectric conversion layer 19 may be highly sensitive to red, the photoelectric conversion layer 17 may be highly sensitive to green, and the photoelectric conversion layer 15 may be highly sensitive to blue.

The barrier layer 18 is located between the photoelectric conversion layers 17 and 19 and is an example of a second barrier layer that forms a second heterojunction barrier against signal charge in the photoelectric conversion layer 17. The barrier layer 18 is the same as the barrier layer 16 according to the first embodiment in that the barrier layer 18 forms a heterojunction barrier against electrons collected by the pixel electrode 11. For example, the barrier layer 18 may be composed of the same material as for the barrier layer 16. The barrier layer 16 is transparent to at least a part of light in a wavelength band absorbed by each of the photoelectric conversion layers 17 and 19. The barrier layer 18 is transparent to at least a part of light in a wavelength band absorbed by the photoelectric conversion layer 19.

Figure 11:
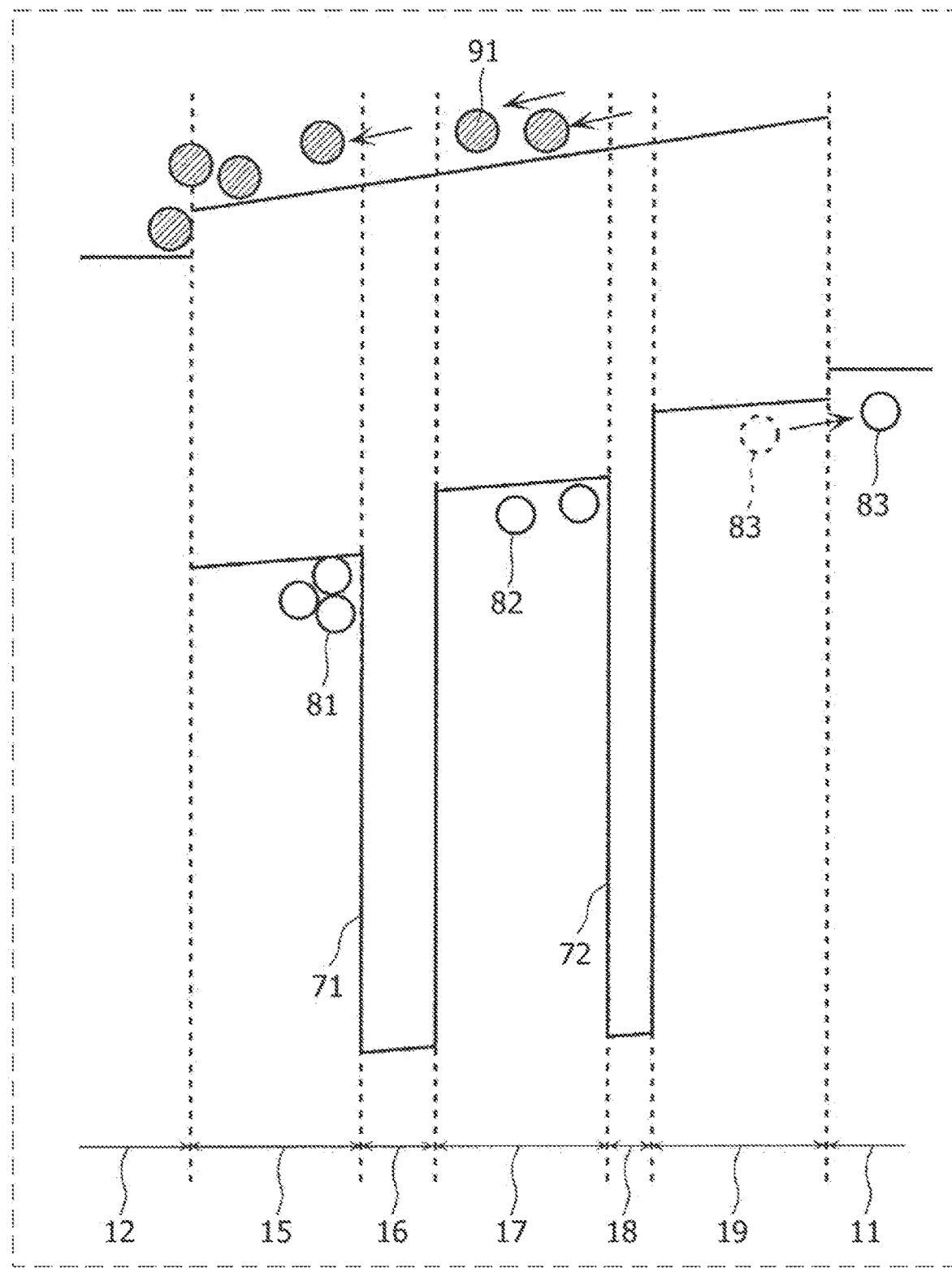
FIG. 11 is a schematic diagram illustrating energy levels during exposure in the imaging device according to the second embodiment.

FIG. 11 is a schematic diagram illustrating energy levels during exposure in the imaging device 100 according to the present embodiment, In FIG. 11, the potential difference between the pixel electrode 11 and the counter electrode 12 is a first potential difference.

As illustrated in FIG. 11, the barrier layer 18 forms a heterojunction barrier 72, which is an example of a second heterojunction barrier. The heterojunction barrier 72 serves as a barrier when the holes 81 and 82 collected by the pixel electrode 11 move from the photoelectric conversion layer 17 to the photoelectric conversion layer 19. At this time, the barrier layer 18 does not behave as a barrier when the electrons 91 collected by the counter electrode 12 move from the photoelectric conversion layer 19 to the photoelectric conversion layer 17.

In the present embodiment, the heterojunction barrier 71 formed by the barrier layer 16 and the heterojunction barrier 72 formed by the barrier layer 18 are different from each other in terms of size. More specifically, a threshold bias voltage for allowing the holes 81 and 82 to pass through are different between the heterojunction barriers 71 and 72.

Figure 12:
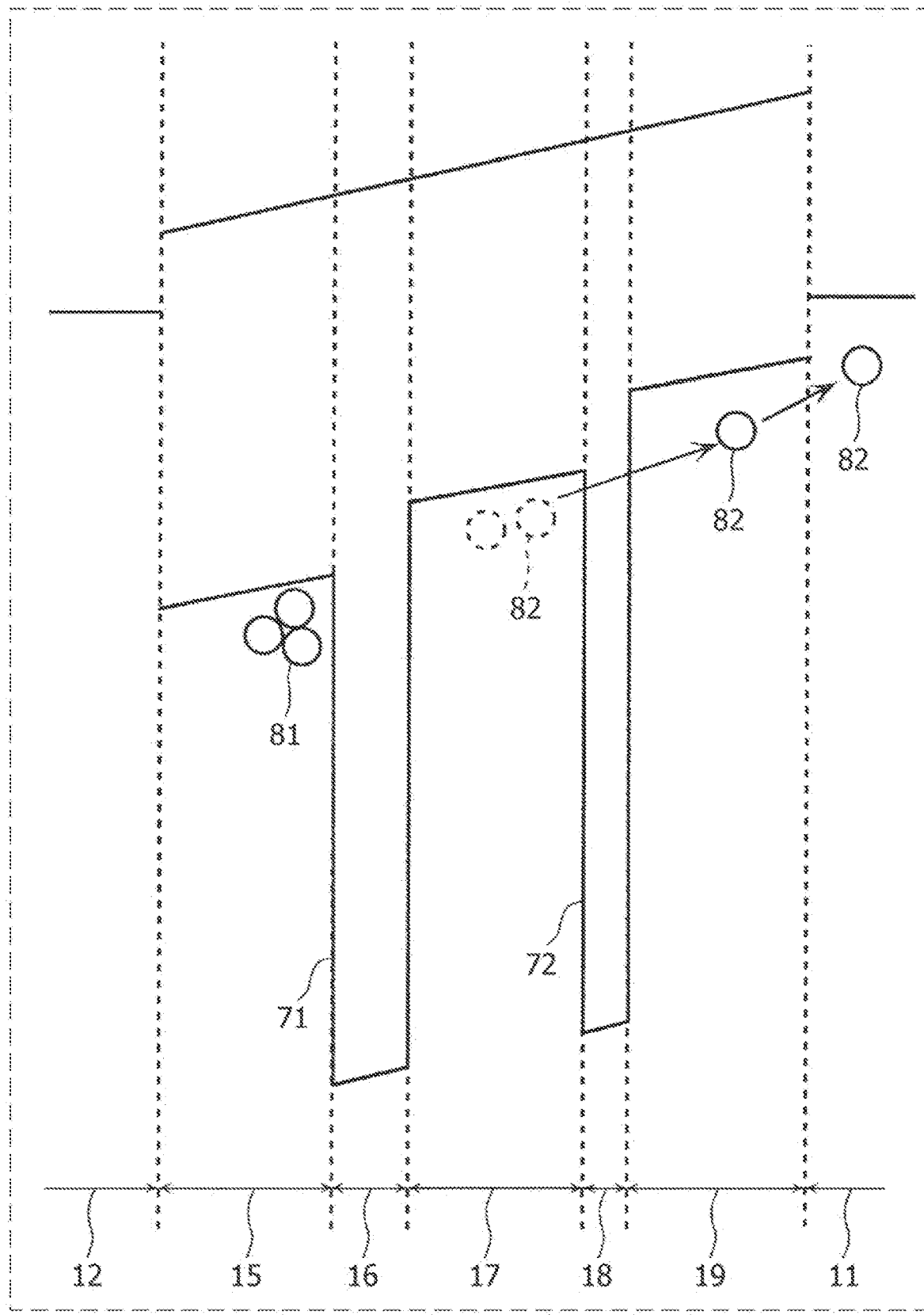
FIG. 12 is a schematic diagram illustrating energy levels during first charge transfer in the imaging device according to the second embodiment.

As illustrated in FIG. 11, for example, the barrier layer 16 is thicker than the barrier layer 18. Because the heterojunction barrier 71 is accordingly thicker than the heterojunction barrier 72, the threshold bias voltage for the heterojunction barrier 71 is higher than that for the heterojunction barrier 72. As illustrated in FIG. 12, therefore, when the potential difference between the pixel electrode 11 and the counter electrode 12 is a third potential difference, which is larger than the first potential difference illustrated in FIG. 11, a state in which the holes 82 pass through the heterojunction barrier 72 due to a tunneling effect but the holes 81 do not pass through the heterojunction barrier 71 can be established. That is, only the holes 82 held in the photoelectric conversion layer 17 can be read. FIG. 12 is a schematic diagram illustrating energy levels during the first charge transfer in the imaging device 100 according to the present embodiment.

Figure 13:
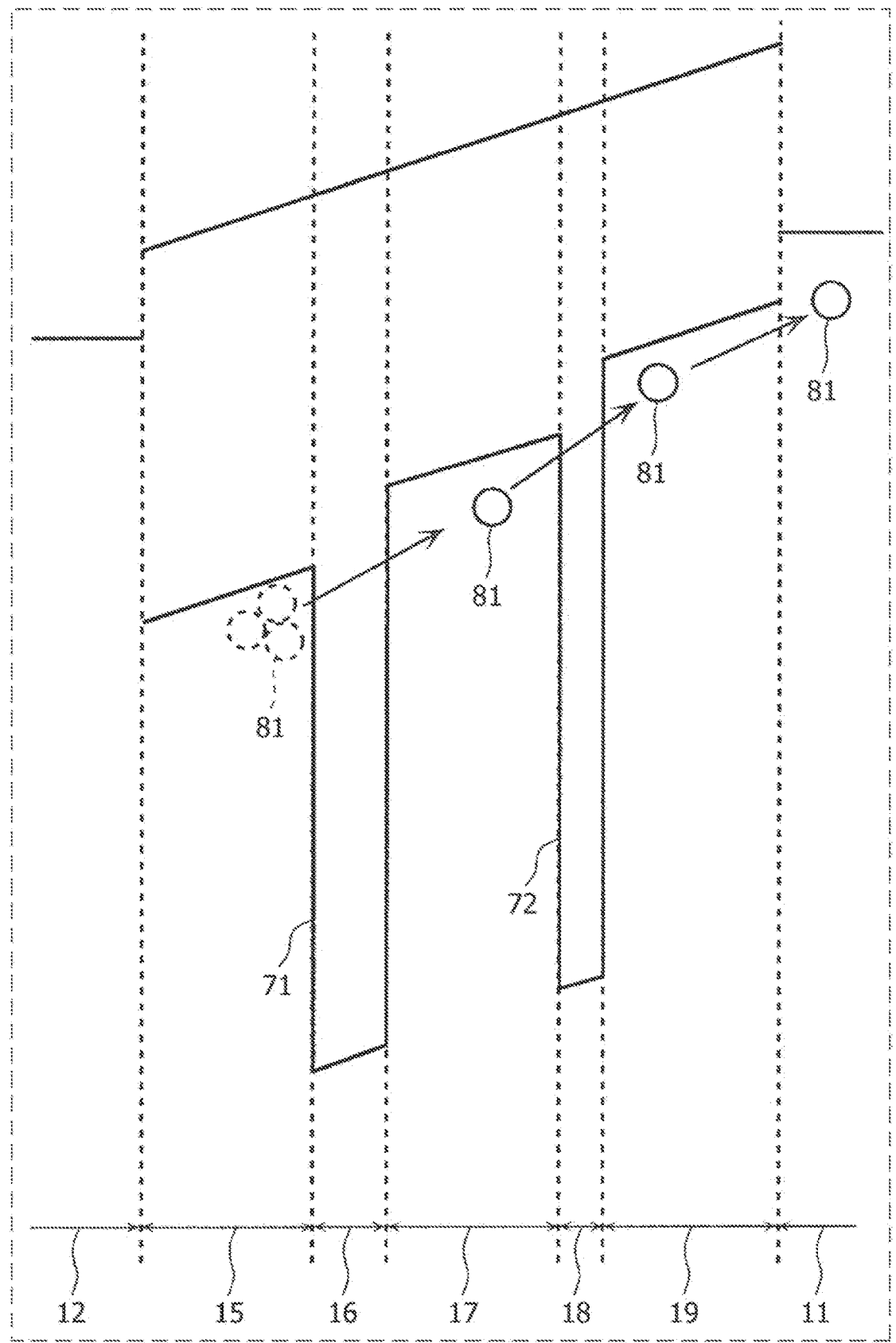
FIG. 13 is a schematic diagram illustrating energy levels during second charge transfer in the imaging device according to the second embodiment.

Furthermore, as illustrated in FIG. 13, when the potential difference between the pixel electrode 11 and the counter electrode 12 is the second potential difference, which is larger than the third potential difference, the holes 81 held in the photoelectric conversion layer 15 can pass through the heterojunction barrier 71. FIG. 13 is a schematic diagram illustrating energy levels during the second charge transfer in the imaging device 100 according to the present embodiment.

As described above, with the imaging device 100 according to the present embodiment, signal charge generated in the photoelectric conversion layers 15, 17, and 19 can be separately read by adjusting the potential difference between the pixel electrode 11 and the counter electrode 12 as in the first embodiment.

The size of the heterojunction barriers 71 and 72 can be adjusted without changing the thickness of the barrier layers 16 and 18. For example, the barrier height of the heterojunction barrier 71 may be greater than that of the heterojunction barrier 72. At this time, the barrier layer 16 may be thicker than or as thick as the barrier layer 18. Alternatively, the barrier layer 16 may be thinner than the barrier layer 18 insofar as the threshold bias voltage for the heterojunction barrier 71 is higher than that for the heterojunction barrier 72. When the barrier layer 16 is thicker than the barrier layer 18, the heterojunction barrier 71 may be as high as or lower than the heterojunction barrier 72 insofar as the threshold bias voltage for the heterojunction barrier 71 is higher than that for the heterojunction barrier 72.

2. Driving Method

Next, a method for driving the imaging device 100 according to the present embodiment will be described. Although a case where the pixel electrode 11 collects holes 81 to 83 as signal charge will be described hereinafter, it is obvious to those skilled in the art that the same operation can be performed to collect the electrons 91 by changing polarity as necessary.

Figure 14:
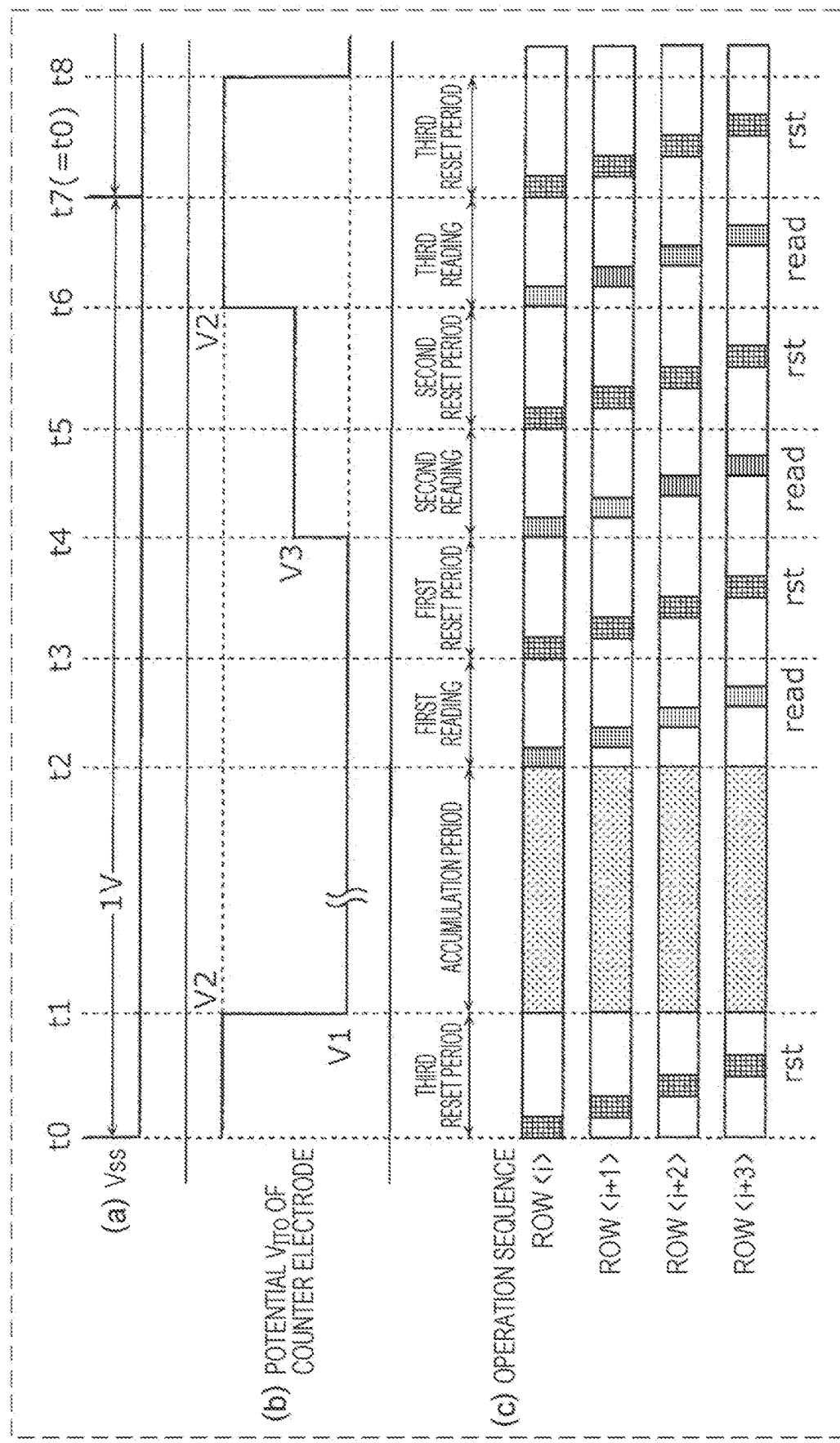
FIG. 14 is a timing chart illustrating an example of a method for driving the imaging device according to the second embodiment.

FIG. 14 is a timing chart illustrating the method for driving the imaging device 100 according to the present embodiment. The driving method that will be described hereinafter is substantially the same as that described in the first embodiment and different from the driving method described in the first embodiment in that the charge reading and the resetting are performed three times each, not twice each. The voltage supply circuit 32 accordingly changes the voltage applied to the counter electrode 12 between three values.

A specific operation sequence of the imaging device 100 is as follows.

Step S0: Initialization (Time t0 to Time t1)

First, signal charge in all the photoelectric conversion layers 15, 17, and 19 and the charge accumulation nodes 41 is eliminated. That is, from the time t0 to the time t1, all the photoelectric conversion layers 15, 17, and 19 and the charge accumulation regions are reset in a state in which all the photoelectric conversion layers 15, 17, and 19 and the pixel electrodes 11 are connected to one another through tunneling.

As illustrated in FIG. 14, for example, resetting of the pixels in the row <i> starts on the basis of the vertical synchronization signal Vss (time t0). More specifically, the bias voltage between each counter electrode 12 and the corresponding pixel electrode 11 is set to a value larger than or equal to the threshold voltages for the heterojunction barriers 71 and 72 such that the potential of the counter electrode 12 becomes higher than that of the pixel electrode 11. That is, the potential $V_{ITO}$ of the counter electrode 12 is set to V2 so that the potential difference between the pixel electrode 11 and the counter electrode 12 becomes the second potential difference, at which the holes 81 can pass through the heterojunction barriers 71 and 72 due to a tunneling effect. After all the photoelectric conversion layers 15, 17, and 19 and the charge accumulation regions are reset, initial values of the potential of the charge accumulation regions may be measured.

Step S1: Exposure (Time t1 to Time t2)

Next, the potential V1, at which the photoelectric conversion layers 15, 17, and 19 can perform photoelectric conversion, is applied to the counter electrode 12 to start the charge accumulation period (from the time t1 to the time t2). Light is radiated onto the imaging device 100 in this state. At this time, signal charge is generated in at least one of the photoelectric conversion layer 15, the photoelectric conversion layer 17, or the photoelectric conversion layer 19. The amount of signal charge generated in each of the photoelectric conversion layers 15, 17, and 19 depends on the spectrum of the light radiated and the spectral sensitivity characteristics of the photoelectric conversion layer.

Since the potential of the counter electrode 12 is higher than that of the pixel electrode 11, movement of charge illustrated in FIG. 11 occurs. More specifically, the holes 83 generated in the photoelectric conversion layer 19 move toward the pixel electrode 11, are collected by the pixel electrode 11, are transported to the charge accumulation node 41, and are accumulated. The electron 91 generated in the photoelectric conversion layer 19 move toward the counter electrode 12. At this time, the barrier layers 18 and 16 do not behave as barriers against the electrons 91. The electrons 91, therefore, penetrate the barrier layers 18 and 16 and are collected by the counter electrode 12 via the photoelectric conversion layers 15 and 17.

The holes 81 generated in the photoelectric conversion layer 15 and the holes 82 generated in the photoelectric conversion layer 17 both move toward the pixel electrode 11. The heterojunction barrier 71 formed by the barrier layer 16, however, behaves as a barrier against the holes 81. The heterojunction barrier 72 formed by the barrier layer 18 behaves as a barrier against the holes 82. Since the potential difference between the pixel electrode 11 and the counter electrode 12 is the first potential difference, which is smaller than or equal to the threshold bias voltage, the holes 81 do not pass through the heterojunction barrier 71, and the holes 82 do not pass through the heterojunction barrier 72. The holes 81 generated in the photoelectric conversion layer 15, therefore, are held in the photoelectric conversion layer 15, and the holes 82 generated in the photoelectric conversion layer 17 are held in the photoelectric conversion layer 17.

The electrons 91 generated in the photoelectric conversion layers 15 and 17 move toward the counter electrode 12 and are collected by the counter electrode 12.

Step S2: First Charge Reading (Time t2 to Time t3)

After the exposure is completed, the holes 83, which are signal charge generated in the photoelectric conversion layer 19, are accumulated in the charge accumulation node 41. The signal detection circuit 14, therefore, measures the amount of charge accumulated in the charge accumulation node 41. The amount of charge accumulated in the charge accumulation node 41 is equal to the amount of signal charge generated in the photoelectric conversion layer 19. More specifically, as illustrated in portion (c) of FIG. 14, charge is sequentially read from the row <i> through a rolling operation.

Step S3: First Charge Resetting (Time t3 to Time t4)

After the first charge reading is completed, the signal charge accumulated in the charge accumulation node 41 is eliminated. As illustrated in portion (b) of FIG. 14, the potential $V_{ITO}$ of the counter electrode 12 is kept at V1 from the time t2 to the time t4, during which the first charge reading and the first resetting are performed. That is, the holes 81 generated in the photoelectric conversion layer 15 do not pass through the heterojunction barrier 71 and are held in the photoelectric conversion layer 15. The holes 82 generated in the photoelectric conversion layer 17, too, do not pass through the heterojunction barrier 72 and are held in the photoelectric conversion layer 17.

Step S4: First Charge Transfer (Time t4)

After the first charge resetting is completed, the bias voltage between the counter electrode 12 and the pixel electrode 11 is set to a value larger than or equal to the threshold bias voltage for the heterojunction barrier 72 and smaller than the threshold bias voltage for the heterojunction barrier 71. More specifically, as illustrated in portion (b) of FIG. 14, the potential $V_{ITO}$ of the counter electrode 12 is set to V3 at the time t4 so that the potential difference between the counter electrode 12 and the pixel electrode 11 becomes the third potential difference. By applying the bias voltage, the holes 82 accumulated in the photoelectric conversion layer 17 pass through the heterojunction barrier 72 due to a tunneling effect, move to the photoelectric conversion layer 19 due to potential gradient, are collected by the pixel electrode 11, and are accumulated in the charge accumulation node 41 as illustrated in FIG. 12.

Step S5: Second Charge Reading (Time t4 to Time t5)

When the charge transfer is completed, the holes 82 generated in the photoelectric conversion layer 17 have been accumulated in the charge accumulation node 41. The signal detection circuit 14, therefore, measures the amount of charge accumulated in the charge accumulation node 41. The amount of charge accumulated in the charge accumulation node 41 is equal to the amount of signal charge generated in the photoelectric conversion layer 17. More specifically, as illustrated in portion (c) of FIG. 14, charge is sequentially read from the row <i> through a rolling operation. The reading operation is the same as in the first charge reading (step S2).

Step S6: Second Charge Resetting (Time t5 to Time t6)

After the second charge reading is completed, the signal charge accumulated in the charge accumulation nodes 41 is eliminated. As illustrated in portion (b) of FIG. 14, the potential $V_{ITO}$ of the counter electrode 12 is kept at V3 from the time t4 to the time t6, during which the first charge transfer, the second charge reading, and the second resetting are performed. That is, the holes 81 generated in the photoelectric conversion layer 15 do not pass through the heterojunction barrier 71 and are held in the photoelectric conversion layer 15.

Step S7: Second Charge Transfer (Time t6)

After the second charge resetting is completed, the bias voltage between the counter electrode 12 and the pixel electrode 11 is set to a value larger than or equal to the threshold bias voltage for the heterojunction barrier 71. More specifically, as illustrated in portion (b) of FIG. 14, the potential $V_{ITO}$ of the counter electrode 12 is set to V2 at the time t6 so that the potential difference between the counter electrode 12 and the pixel electrode 11 becomes the second potential difference. By applying the bias voltage, the holes 81 accumulated in the photoelectric conversion layer 15 pass through the heterojunction barriers 71 and 72 due to a tunneling effect, move to the photoelectric conversion layer 19 due to potential gradient, are collected by the pixel electrode 11, and are accumulated in the charge accumulation node 41 as illustrated in FIG. 13.

Step S8: Third Charge Reading (Time t6 to Time t7)

When the charge transfer is completed, the holes 81 generated in the photoelectric conversion layer 15 have been accumulated in the charge accumulation node 41. The signal detection circuit 14, therefore, measures the amount of charge accumulated in the charge accumulation node 41. The amount of charge accumulated in the charge accumulation node 41 is equal to the amount of signal charge generated in the photoelectric conversion layer 15. More specifically, as illustrated in portion (c) of FIG. 14, charge is sequentially read from the row <i> through a rolling operation. The reading operation is the same as in the first charge reading (step S2).

Step S9: Third Charge Resetting (Time t7 to Time t8)

After the third charge reading is completed, the signal charge accumulated in the charge accumulation nodes 41 is eliminated. As a result, the photoelectric conversion layers 15, 17, and 19 and the charge accumulation nodes 41 are reset, and the pixel array PA are initialized. That is, the state at the time t1 is established again at a time t8. A moving image can be obtained by repeating steps S1 to S9.

Signal charge generated in the photoelectric conversion layers 15, 17, and 19 can thus be separately read by providing a plurality of heterojunction barriers and using different threshold bias voltages for the heterojunction barriers. For example, when the three photoelectric conversion layers 15, 17, and 19 are prepared for RGB, respectively, the RGB components can be independently read. The number of photoelectric conversion layers capable of performing independent reading may be more than three.

In the driving method illustrated in FIG. 14, an accumulation period does not perfectly match between the photoelectric conversion layers 15, 17, and 19. More specifically, an accumulation period of the photoelectric conversion layer 19 is essentially from the time t1 to an end of a first reading period. An accumulation period of the photoelectric conversion layer 17 is from the time t1 to an end of a second reading period. An accumulation period of the photoelectric conversion layer 15 is from the time t1 to an end of a third reading period.

Figure 15:
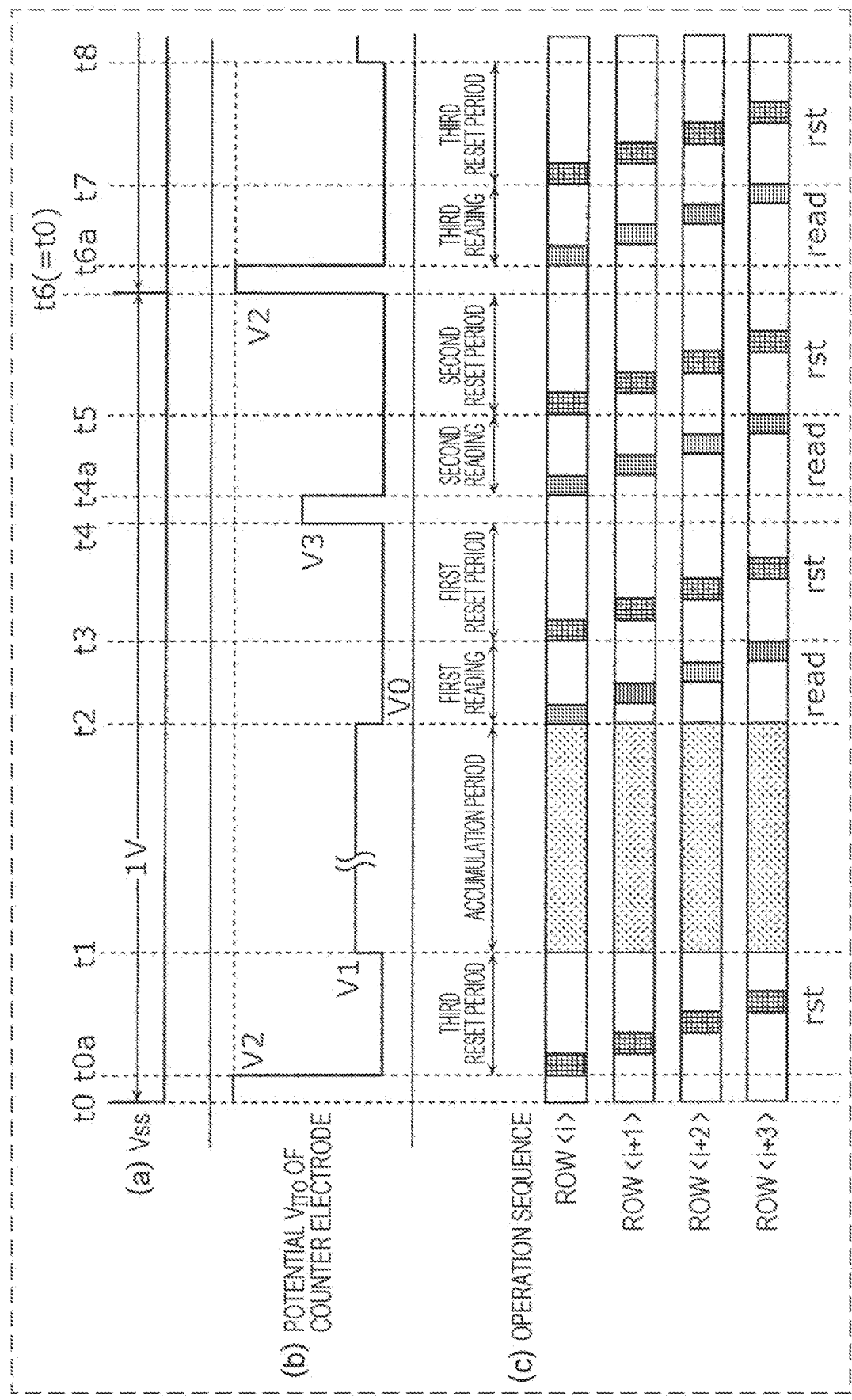
FIG. 15 is a timing chart illustrating another example of the method for driving the imaging device according to the second embodiment.

Alternatively, the imaging device 100 may be driven on the basis of an operation illustrated in FIG. 15. FIG. 15 is a timing chart illustrating another example of the method for driving the imaging device 100 according to the present embodiment. In the example illustrated in FIG. 15, after charge is transferred to the charge accumulation node 41 from the photoelectric conversion layers 15, 17, and 19, the sensitivity of the photoelectric conversion layers 15, 17, and 19 becomes zero, that is, the photoelectric conversion layers 15, 17, and 19 enter a global shutter state. The reading and resetting of the charge transferred to the charge accumulation node 41 are performed in the global shutter state. In the global shutter state, no signal charge is newly generated in the photoelectric conversion layers 15, 17, and 19.

From the time t2 to the time t4, for example, the potential $V_{ITO}$ of the counter electrode 12 is set to a potential V0, at which the sensitivity of the photoelectric conversion layer 15, 17, and 19 becomes zero. At the potential V0, for example, the potential difference between the counter electrode 12 and the pixel electrode 11 becomes zero. As a result, accumulation of charge during the reading periods and the reset periods due to the rolling operation can be prevented.

In the example illustrated in FIG. 15, the global shutter state is established from the time t0a to the time t1, from the time t2 to the time t4, from the time t4a to the time t6, and from a time t6a to the time t8. A period for transferring signal charge to the charge accumulation node 41 from the photoelectric conversion layers 15 and 17 is provided immediately before the time t0a, the time t4a, and the time t6a.

The period from the time t0 to the time t0a, for example, is a period for transferring charge remaining in the photoelectric conversion layers 15, 17, and 19 to the charge accumulation node 41 for the initialization. In the period from the time t0 to the time t0a, the potential $V_{ITO}$ of the counter electrode 12 is V2 as illustrated in portion (b) of FIG. 15. As a result, the signal charge remaining in the photoelectric conversion layer 15 passes through the heterojunction barriers 71 and 72 and is transferred to the charge accumulation node 41. The signal charge remaining in the photoelectric conversion layer 17 also passes through the heterojunction barrier 72 and is transferred to the charge accumulation node 41. The signal charge remaining in the photoelectric conversion layer 19 is also transferred to the charge accumulation node 41.

Similarly, the period from the time t4 to the time t4a is a period for transferring the holes 81 held in the photoelectric conversion layer 17. As illustrated in portion (b) of FIG. 15, the potential $V_{ITO}$ of the counter electrode 12 is V3. As a result, the holes 82 generated in the photoelectric conversion layer 17 pass through the heterojunction barrier 72 and are transferred to the charge accumulation node 41.

A period from the time t6 to the time t6a is a period for transferring the holes 81 held in the photoelectric conversion layer 15. As illustrated in portion (b) of FIG. 15, the potential $V_{ITO}$ of the counter electrode 12 is V2. As a result, the holes 81 generated in the photoelectric conversion layer 15 pass through the heterojunction barriers 71 and 72 and are transferred to the charge accumulation node 41.

Signal charge to be read is thus transferred to the charge accumulation node 41 immediately before the global shutter state is established. The reading and the resetting are then performed in the global shutter state. The period from the time t0 to the time t0a, the period from the time t4 to the time t4a, and the period from the time t6 to the time t6a, in which charge is transferred, are shorter than a period for which the global shutter state remains established. An effect produced by the difference between essential lengths of the exposure periods of the photoelectric conversion layers 15, 17, and 19 therefore, can be reduced.

In this example, film capacitances of the photoelectric conversion layers 15, 17, and 19 connected to the charge accumulation node 41 look different depending on a sequence for reading charge from the photoelectric conversion layers 15, 17, and 19. In other words, conversion gain differs depending on a state in which signal charge in each of the photoelectric conversion layers 15, 17, and 19 is read.

In a period from the time t1 to the time t4 illustrated in FIG. 14, for example, an equivalent circuit in which the photoelectric conversion layer 19 is connected to the charge accumulation node 41 can be assumed. At this time, the conversion gain is determined on the basis of the total capacitance of the charge accumulation node 41 and the photoelectric conversion layer 19. More specifically, the conversion gain is determined on the basis of the total capacitance obtained from parallel plate capacitance of the barrier layer 18 and the pixel electrode 11 and capacitance of the charge accumulation node 41.

In the period from the time t4 to the time t6 illustrated in FIG. 14, an equivalent circuit in which the photoelectric conversion layers 17 and 19 are connected to the charge accumulation node 41 can be assumed. At this time, the conversion gain is determined on the basis of the total capacitance of the charge accumulation node 41 and the photoelectric conversion layers 17 and 19. More specifically, the conversion gain is determined on the basis of the total capacitance obtained from parallel plate capacitance of the barrier layer 16 and the pixel electrode 11 and the capacitance of the charge accumulation node 41.

The same holds for a period from the time t6 to the time t8 illustrated in FIG. 14. The conversion gain thus depends on the potential of the counter electrode 12. This is because the conversion gain varies depending on the thickness of the photoelectric conversion layers 15, 17, and 19 in a tunneling state, which contributes to effective capacitances, and CV characteristics of the photoelectric conversion layers 15, 17, and 19.

With the method illustrated in FIG. 15, the above problem is suppressed. That is, in each reading period, the above problem is suppressed by setting the potential $V_{ITO}$ of the counter electrode 12 to the potential V0, which is a constant value. The potential V0 is, as described above, a potential at which the global shutter state is established. An effect of significantly reducing parasitic sensitivity can also be produced. The potential of the counter electrode 12 in each reading period is not limited to the potential V0. For example, the potential of the counter electrode 12 in each reading period may be lower than in the charge accumulation periods. Alternatively, the potential of the counter electrode 12 in each reading period may be lower than the potentials V2 and V3 of the counter electrode 12 in the periods in which the tunneling state is established.

In the method illustrated in FIG. 14, for example, data for calculating conversion gain may be obtained in advance. By correcting the conversion gain using the obtained data, an effect of variation in the conversion gain in each reading period can be reduced. When the photoelectric conversion layers 15, 17, and 19 are used to detect RGB light, for example, desirable white balancing can be achieved.

Inconsideration of the white balancing, a signal may be transmitted to the outside of a sensor or an image signal processor (ISP) with a certain coefficient used in each reading period, in order to read charge from a desired photoelectric conversion layer. In this case, color signal processing can be simplified. That is, signal processing can be simplified and power consumption can be reduced by changing gain in reading in accordance with each reading period.

Third Embodiment

Next, a third embodiment will be described. The third embodiment is different from the first embodiment in that a photoelectric conversion unit includes charge block layers. Differences from the first embodiment will be mainly described hereinafter, and description of common features is omitted or simplified.

Figure 16:
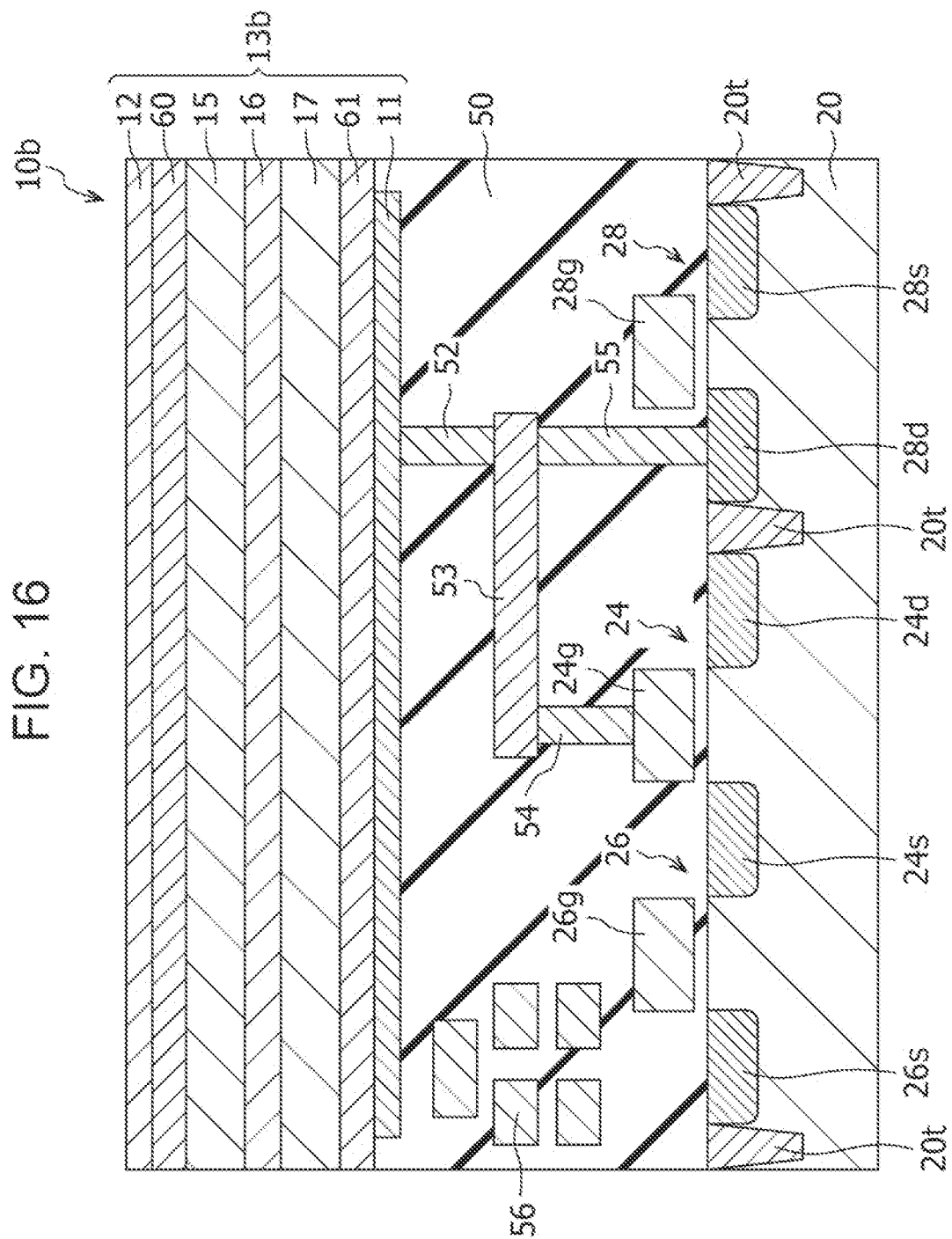
FIG. 16 is a schematic cross-sectional view of the cross-sectional structure of one of pixels of an imaging device according to a third embodiment.

FIG. 16 is a schematic cross-sectional view of the cross-sectional structure of one of pixels of an imaging device according to the present embodiment. As illustrated in FIG. 16, a pixel 10b in the imaging device is different from the pixel 10 according to the first embodiment in that the pixel 10b includes a photoelectric conversion unit 13b instead of the photoelectric conversion unit 13. Unlike the photoelectric conversion unit 13 according to the first embodiment, the photoelectric conversion unit 13b further includes charge block layers 60 and 61.

The charge block layer 60 is located between the counter electrode 12 and the photoelectric conversion layer 15 and is an example of a charge block layer for restricting movement of signal charge to one direction, namely from the photoelectric conversion layer 15 to the pixel electrode 11. When the counter electrode 12 collects electrons, the charge block layer 60 is a so-called "hole block layer", which restricts movement of holes, not electrons. More specifically, the charge block layer 60 forms a heterojunction barrier against holes and does not form a heterojunction barrier against electrons. Alternatively, the charge block layer 60 may form a heterojunction layer against electrons lower than the heterojunction layer against holes.

When the counter electrode 12 collects holes, the charge block layer 60 is a so-called "electron block layer", which restricts movement of electrons, not holes. More specifically, the charge block layer 60 forms a heterojunction barrier against electrons and does not form a heterojunction barrier against holes. Alternatively, the charge block layer 60 may form a heterojunction barrier against holes lower than the heterojunction barrier against electrons.

The charge block layer 61 is located between the pixel electrode 11 and the photoelectric conversion layer 17 and is an example of a charge block layer for restricting movement of charge whose polarity is opposite that of signal charge to one direction, namely from the photoelectric conversion layer 17 to the counter electrode 12. When the pixel electrode 11 collects electrons, the charge block layer 61 is a hole block layer. When the pixel electrode 11 collects holes, the charge block layer 61 is an electron block layer.

The charge block layers 60 and 61 are composed, for example, of organic semiconductor materials as with the barrier layer 16. The charge block layer 60 is transparent at least to a part of light in a wavelength band absorbed by each of the photoelectric conversion layers 15 and 17. As described in the first embodiment, the charge block layers 60 and 61 are composed of materials that function as a hole block layer and an electron block layer.

As described above, with the imaging device according to the present embodiment, injection of charge from an electrode side to a photoelectric conversion layer side during the charge transfer can be suppressed. As a result, the S/N ratio of the imaging device improves. The photoelectric conversion unit 13b may include only either the charge block layer 60 or 61, instead.

In the present embodiment, an example in which the photoelectric conversion unit 13b includes two photoelectric conversion layers has been described. The present embodiment, however, may also be applied to a configuration in which a photoelectric conversion unit includes three photoelectric conversion layers as in the second embodiment and a configuration in which a photoelectric conversion unit includes four or more photoelectric conversion layers.

Fourth Embodiment

Next, a fourth embodiment will be described. The fourth embodiment is different from the first embodiment in that a photoelectric conversion unit includes a shield electrode. Differences from the first embodiment will be mainly described hereinafter, and description of common features is omitted or simplified.

Figure 17:
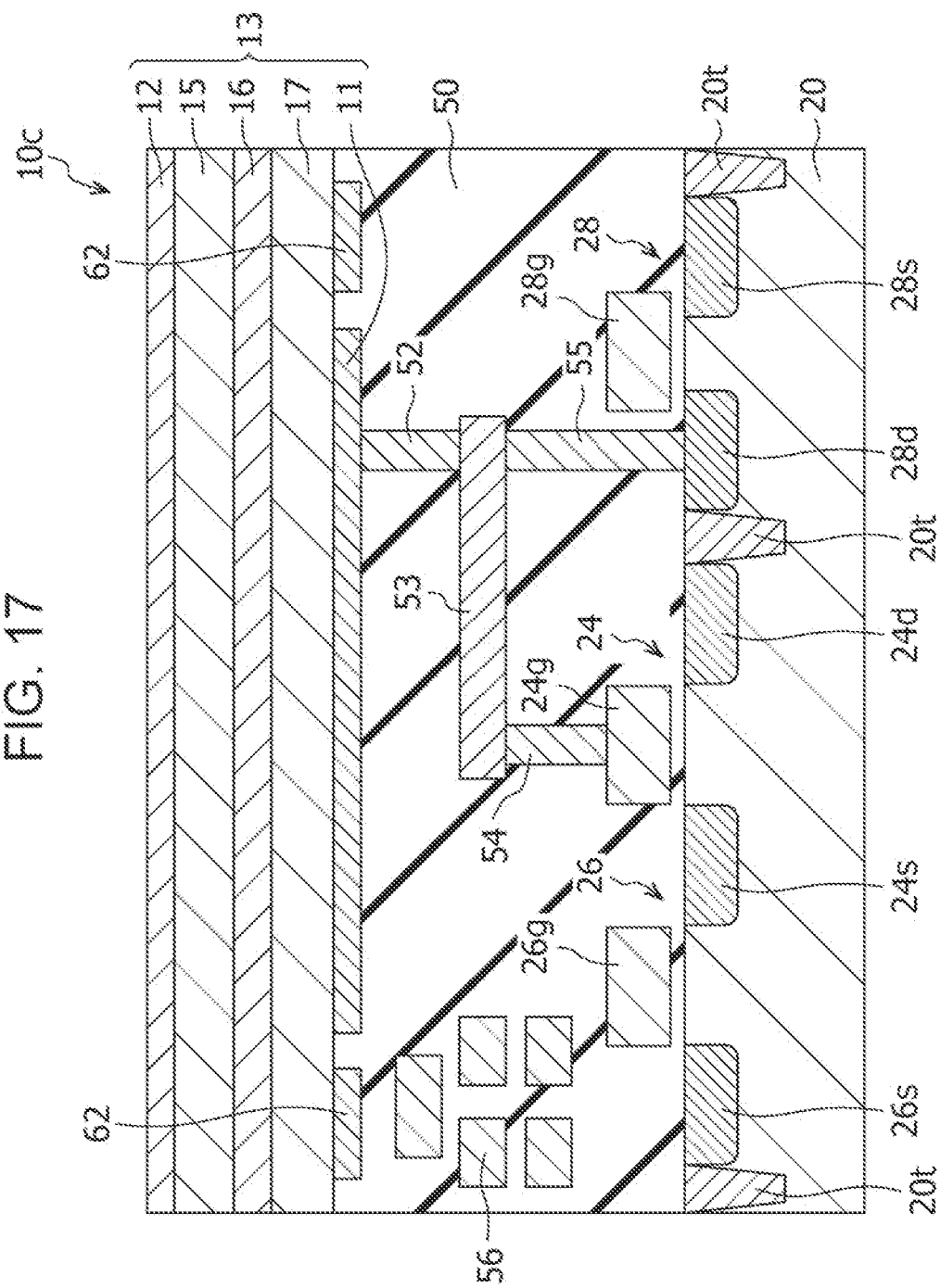
FIG. 17 is a schematic cross-sectional view of the cross-sectional structure of one of pixels of an imaging device according to a fourth embodiment.

FIG. 17 is a schematic cross-sectional view of the cross-sectional structure of one of pixels of an imaging device according to the present embodiment. As illustrated in FIG. 17, a pixel 10c in the imaging device is different from the pixel 10 according to the first embodiment in that the pixel 10c in the imaging device newly includes a shield electrode 62.

The shield electrode 62 is provided around the pixel electrode 11, and a certain potential is applied to the shield electrode 62. As an appropriate potential is applied to the shield electrode 62, horizontal potential differences are caused in the photoelectric conversion layers 15 and 17. As a result, horizontal movement of signal charge in the photoelectric conversion layers 15 and 17 can be suppressed.

Figure 18:
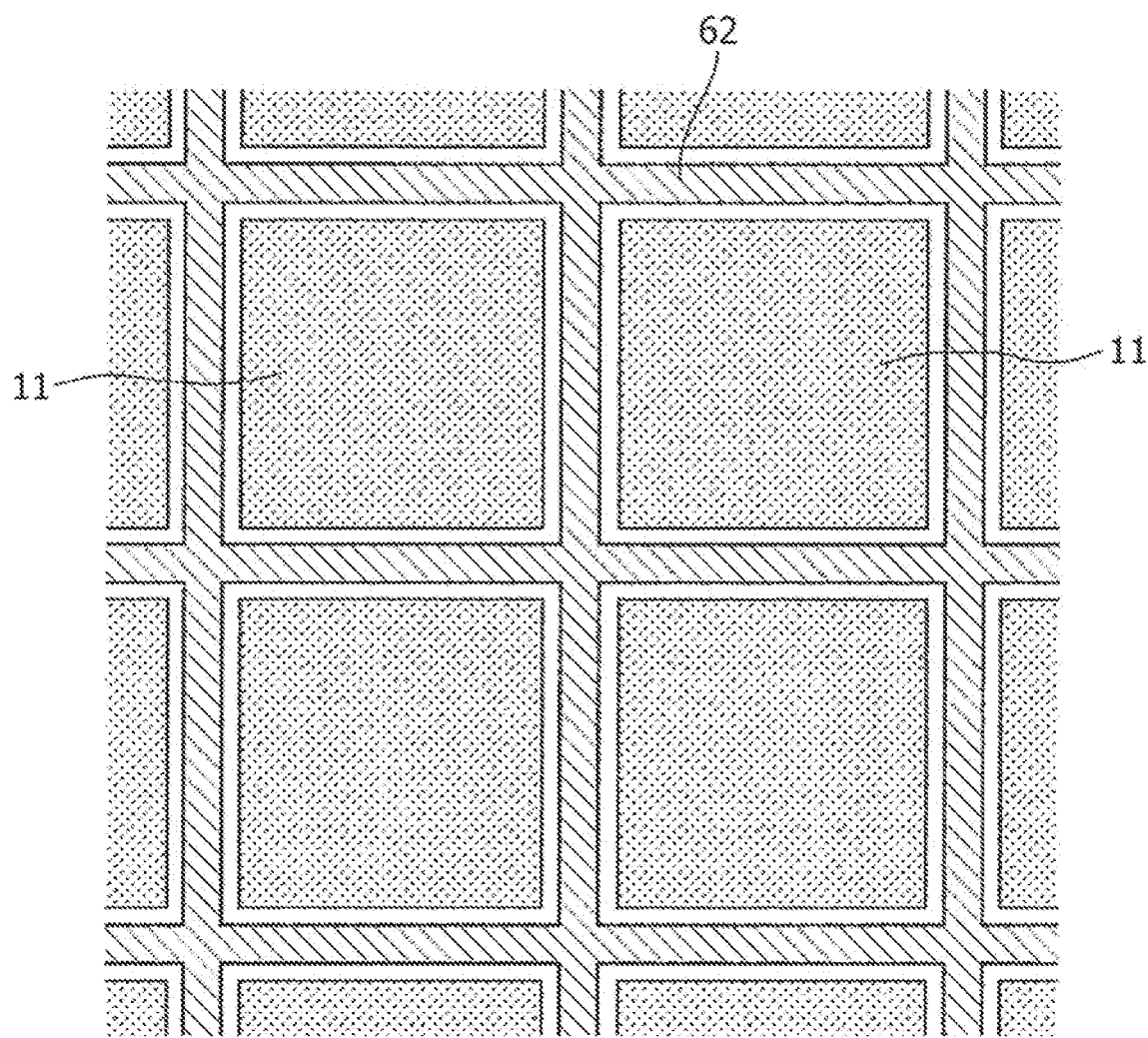
FIG. 18 is a plan view of the planar layout of pixel electrodes and a shield electrode in an imaging device according to the fourth embodiment.

FIG. 18 is a plan view of the planar layout of the pixel electrodes 11 and the shield electrode 62 in the imaging device according to the present embodiment. As illustrated in FIG. 18, a planar shape of the pixel electrodes 11 is square, and the pixel electrodes 11 are arranged in a matrix. In this case, the shield electrode 62 is arranged in a grid pattern between the adjacent pixel electrodes 11 without being in contact with the pixel electrode 11. Shapes of the pixel electrodes 11 and the shield electrode 62 are not particularly limited. For example, the pixel electrode 11 may have a shape of a circle or a regular polygon such as a regular hexagon or a regular octagon, instead. In this case, the shield electrode 62 may be a plate with openings having a shape of a circle or a regular polygon and arranged in a matrix.

As described above, with the imaging device according to the present embodiment, even when the photoelectric conversion layers 15 and 17 extend over a plurality of pixels 10c, signal charge generated in the pixels 10c does not mix between the pixels 10c. As a result, mixing between the pixels and deterioration of image quality can be suppressed.

In the present embodiment, an example in which the photoelectric conversion unit includes two photoelectric conversion layers has been described. The present embodiment, however, may also be applied to a case where a photoelectric conversion unit includes three photoelectric conversion layers as in the second embodiment.

Fifth Embodiment

Next, a fifth embodiment will be described. The fifth embodiment is different from the first embodiment in that a photoelectric conversion unit includes an element isolation region. Differences from the first embodiment will be mainly described hereinafter, and description of common features is omitted or simplified.

Figure 19:
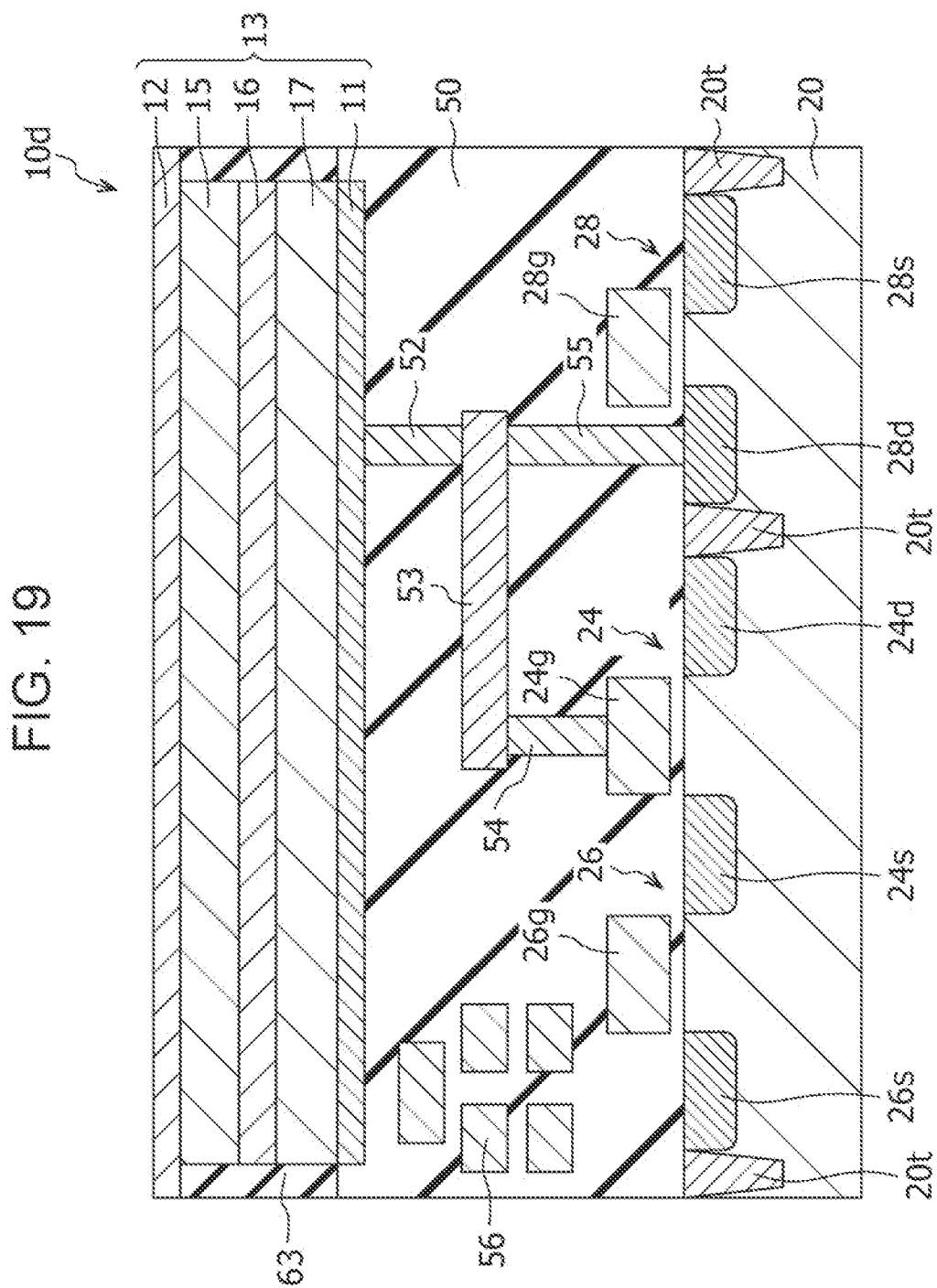
FIG. 19 is a schematic cross-sectional view of the cross-sectional structure of one of pixels of an imaging device according to a fifth embodiment.

FIG. 19 is a schematic cross-sectional view of the cross-sectional structure of one of pixels of an imaging device according to the present embodiment. As illustrated in FIG. 19, a pixel 10d in the imaging device is different from the pixel 10 according to the first embodiment in that the pixel 10d newly includes a pixel isolation region 63.

The pixel isolation region 63 isolates at least one of the photoelectric conversion layer 15 or the photoelectric conversion layer 17 for each of the pixels 10d. In the present embodiment, the pixel isolation region 63 isolates the photoelectric conversion layer 15, the barrier layer 16, and the photoelectric conversion layer 17 for each of the pixels 10d. The pixel isolation region 63 may also isolate the counter electrode 12.

The pixel isolation region 63 is composed, for example, of a material having electrical insulation. The pixel isolation region 63 may block light or be transparent. As with the shield electrode 62 illustrated in FIG. 18, for example, the pixel isolation region 63 is arranged in a grid pattern in such a way as to surround each of the pixels 10d.

With the above configuration. mixing between the pixels and deterioration of image quality can be sufficiently suppressed.

In the present embodiment, an example in which the photoelectric conversion unit includes two photoelectric conversion layers has been described. The present embodiment, however, may also be applied to a configuration in which a photoelectric conversion unit includes three photoelectric conversion layers as in the second embodiment and a configuration in which a photoelectric conversion unit includes four or more photoelectric conversion layers.

Sixth Embodiment

Next, a sixth embodiment will be described. The sixth embodiment is different from the first embodiment in that color filters are provided above a photoelectric conversion unit. Differences from the first embodiment will be mainly described hereinafter, and description of common features is omitted or simplified.

Figure 20:
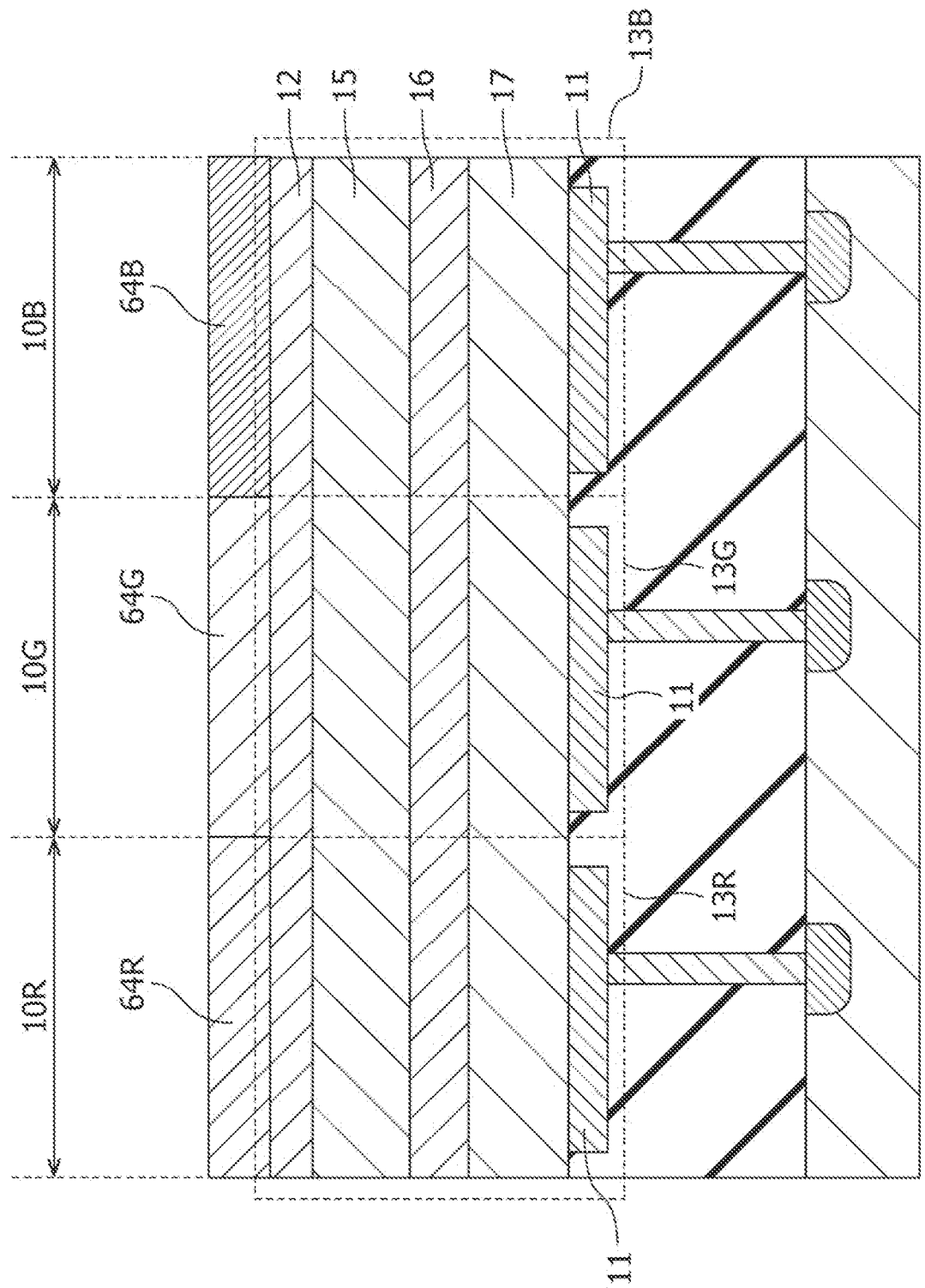
FIG. 20 is a schematic cross-sectional view of the cross-sectional structure of pixels of an imaging device according to a sixth embodiment.

FIG. 20 is a schematic cross-sectional view of the cross-sectional structure of pixels of an imaging device according to the present embodiment. As illustrated in FIG. 20, the imaging device includes pixels 10R, 10G, and 10B. The pixels 10R each include a photoelectric conversion unit 13R and a color filter 64R provided above the photoelectric conversion unit 13R. The pixels 10G each include a photoelectric conversion unit 13G and a color filter 64G provided above the photoelectric conversion unit 13G. The pixels 10B each include a photoelectric conversion unit 13B and a color filter 64B provided above the photoelectric conversion unit 13B.

The photoelectric conversion units 13R, 13G, and 13B each have the same structure as the photoelectric conversion unit 13 according to the first embodiment. More specifically, the photoelectric conversion units 13R, 13G, and 13B each include the pixel electrode 11, the counter electrode 12, the photoelectric conversion layer 15, the barrier layer 16, and the photoelectric conversion layer 17. For example, the photoelectric conversion layer 15 is sensitive to visible light, and the photoelectric conversion layer 17 is sensitive to infrared light.

The color filter 64R is transparent to red light and blocks light in a visible light band other than red light. The color filter 64G is transparent to green light and blocks light in wavelength bands other than that of green light. The color filter 64B is transparent to blue light and blocks light in wavelength bands other than that of blue light. The color filters 64R, 64G, and 64B are all transparent to infrared light.

With the above configuration, since red light and infrared light are incident on the photoelectric conversion unit 13R of the pixel 10R, signal charge corresponding to red light is generated in the photoelectric conversion layer 15 of the photoelectric conversion unit 13R, and signal charge corresponding to infrared light is generated in the photoelectric conversion layer 17 of the photoelectric conversion unit 13R. Since green light and infrared light are incident on the photoelectric conversion unit 13G of the pixel 10G, signal charge corresponding to green light is generated in the photoelectric conversion layer 15 of the photoelectric conversion unit 13G, and signal charge corresponding to infrared light is generated in the photoelectric conversion layer 17 of the photoelectric conversion unit 13G. Since blue light and infrared light are incident on the photoelectric conversion unit 13B of the pixel 10B, signal charge corresponding to blue light is generated in the photoelectric conversion layer 15 of the photoelectric conversion unit 13B, and signal charge corresponding to infrared light is generated in the photoelectric conversion layer 17 of the photoelectric conversion unit 13B.

As a result, since signal charge corresponding to RGB is generated and read in the pixels 10R, 10G, and 10B, respectively, a color image can be generated. In addition, since signal charge corresponding to infrared light is generated and read in the pixels 10R, 10G, and 10B, an infrared image can be generated.

The number of types of color filter included in the imaging device according to the present embodiment is not limited to three, and may be one, two, or four or more, instead. Wavelengths of light that passes through and is blocked by the color filters are not particularly limited.

In the present embodiment, an example in which the photoelectric conversion unit includes two photoelectric conversion layers has been described. The present embodiment, however, may also be applied to a configuration in which a photoelectric conversion unit includes three photoelectric conversion layers as in the second embodiment and a configuration in which a photoelectric conversion unit includes four or more photoelectric conversion layers.

Seventh Embodiment

Next, a seventh embodiment will be described. The seventh embodiment is different from the first embodiment in that spectral sensitivity characteristics of two photoelectric conversion layers included in a photoelectric conversion unit are the same. Differences from the first embodiment will be mainly described hereinafter, and description of common features is omitted or simplified.

Figure 21:
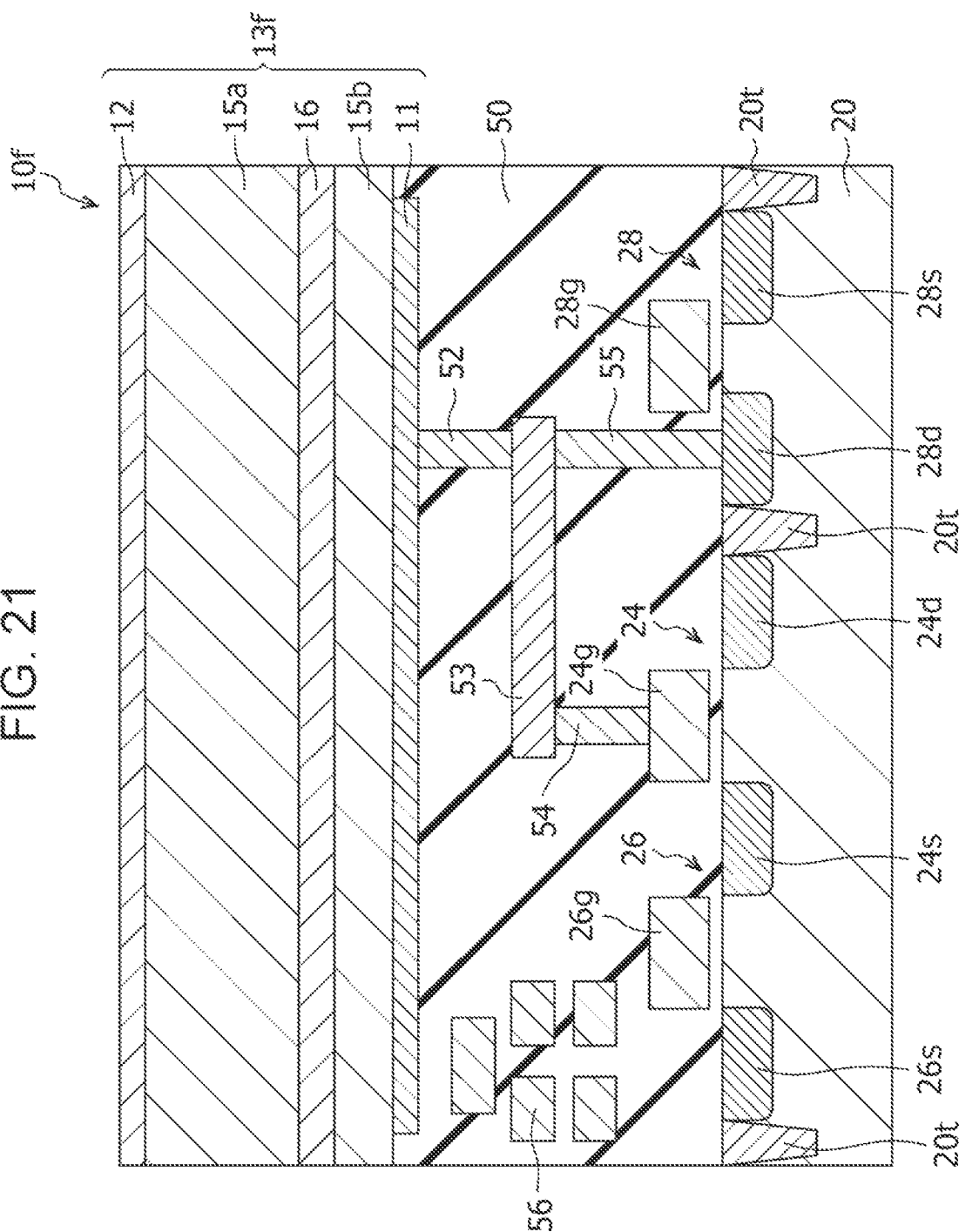
FIG. 21 is a schematic cross-sectional view of the cross-sectional structure of one of pixels of an imaging device according to a seventh embodiment.

FIG. 21 is a schematic cross-sectional view of the cross-sectional structure of one of pixels of an imaging device according to the present embodiment. As illustrated in FIG. 21, a pixel 10f of the imaging device is different from the pixel 10 according to the first embodiment in that the pixel 10f includes a photoelectric conversion unit 13f instead of the photoelectric conversion unit 13.

Unlike the photoelectric conversion unit 13, the photoelectric conversion unit 13f includes photoelectric conversion layers 15a and 15b instead of the photoelectric conversion layers 15 and 17. In the present embodiment, the photoelectric conversion layers 15a and 15b have the same spectral sensitivity characteristics. For example, the photoelectric conversion layers 15a and 15b may be composed of the same material.

Signal charge generated in the photoelectric conversion layers 15a and 15b is transferred to the charge accumulation node 41 and read. There is a limit to the amount of charge that can be held in the charge accumulation node 41, and the total amount of signal charge generated in the photoelectric conversion layers 15a and 15b can exceed the limit of the charge accumulation node 41. In this case, too, when the amount of signal charge in each of the photoelectric conversion layers 15a and 15b is smaller than the limit, an amount of signal charge exceeding the limit of the charge accumulation node 41 can be read by separately transferring the signal charge to the charge accumulation node 41 and reading the signal charge. As a result, a range of the amount of light that can be detected increases. That is, according to the present embodiment, a dynamic range of the sensitivity of the imaging device increases.

In the present embodiment, an example in which the photoelectric conversion unit includes two photoelectric conversion layers has been described. The present embodiment, however, may also be applied to a configuration in which a photoelectric conversion unit includes three photoelectric conversion layers as in the second embodiment and a configuration in which a photoelectric conversion unit includes four or more photoelectric conversion layers.

Eighth Embodiment

Next, an eighth embodiment will be described.

Figure 22:
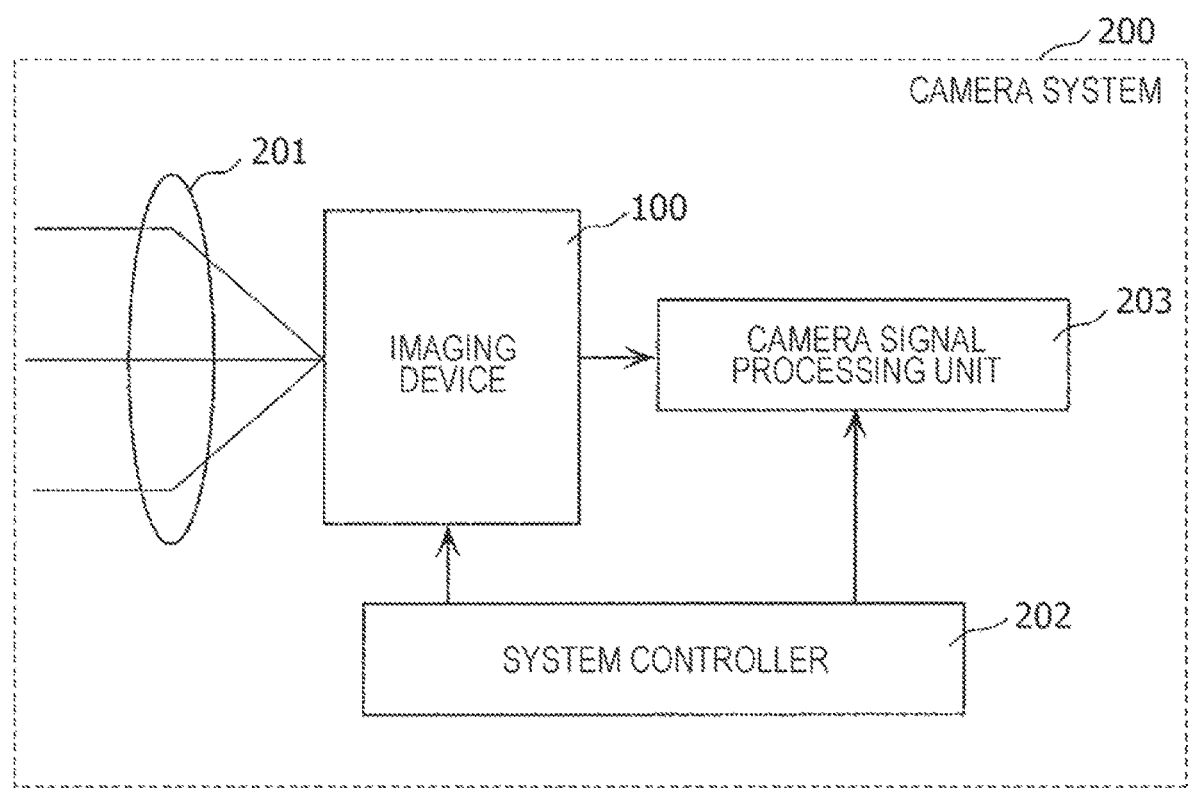
FIG. 22 is a block diagram illustrating the structure of a camera system according to an eighth embodiment.

FIG. 22 is a diagram illustrating an example of a camera system 200 including an imaging device according to the present embodiment. Here, a camera system 200 including the imaging device 100 according to the first embodiment will be described. The camera system 200 may include the imaging device according to one of the second to seventh embodiments instead of the imaging device 100.

As illustrated in FIG. 22, the camera system 200 includes a lens optical system 201, the imaging device 100, a system controller 202, and a camera signal processing unit 203.

The lens optical system 201 includes, for example, an autofocus lens, a zoom lens, and a diaphragm. The lens optical system 201 condenses light onto an imaging surface of the imaging device 100. Light that has passed through the lens optical system 201 is incident on the imaging device 100 from a side of the counter electrode 12, and the photoelectric conversion layers 15 and 17 perform photoelectric conversion.

The system controller 202 controls the imaging device 100 and the camera signal processing unit 203. The system controller 202 may be, for example, a microcomputer.

The camera signal processing unit 203 functions as a signal processing circuit that processes signals of data obtained by the imaging device 100 and that outputs the processed signal as an image or data. The camera signal processing unit 203 performs, for example, processing such as gamma correction, color interpolation, spatial interpolation, and white balancing. The camera signal processing unit 203 may be, for example, a digital signal processor (DSP).

Other Embodiments

Although the imaging device and the method for driving the imaging device according to one or a plurality of aspects have been described on the basis of some embodiments, the present disclosure is not limited to these embodiments. The scope of the present disclosure also includes modes obtained by modifying the above embodiments in various ways conceivable by those skilled in the art and modes obtained by combining components from different embodiments, insofar as the spirit of the present disclosure is not deviated from.

For example, the barrier layers 16 and 18 may form traps for charge whose polarity is opposite that of signal charge. The traps are shallower than the barrier height of a heterojunction barrier against signal charge. In this case, too, movement of charge whose polarity is opposite that of signal charge can be less restricted.

In addition, for example, the height of the heterojunction barriers 71 and 72 formed by the barrier layers 16 and 18, respectively, may be smaller than 0.5 eV, instead. For example, by making the barrier layers 16 and 18 thicker, the heterojunction barriers 71 and 72 can be kept at sizes with which movement of signal charge can be restricted.

In addition, the above embodiments may be subjected to various types of modification, replacement, addition, omission, or the like within the scope of the claims or a scope equivalent thereto.

The imaging device and the method for driving the imaging device in the present disclosure can be used, for example, for image sensors included in camera. More specifically, the imaging device and the method for driving the imaging device in the present disclosure can be used for medical cameras, robot cameras, security cameras, vehicle cameras, and the like.

What is claimed is:

1. An imaging device comprising:
   a pixel electrode;
   a counter electrode that faces the pixel electrode;
   a first photoelectric conversion layer that is located between the pixel electrode and the counter electrode and that generates first signal charge;
   a second photoelectric conversion layer that is located between the first photoelectric conversion layer and the pixel electrode and that generates second signal charge;
   a first barrier layer that is located between the first photoelectric conversion layer and the second photoelectric conversion layer and that forms a first heterojunction barrier against the first signal charge in the first photoelectric conversion layer; and
   a charge accumulator that is electrically connected to the pixel electrode and that accumulates the first signal charge and the second signal charge.

2. The imaging device according to claim 1,
   wherein the first barrier layer does not form a heterojunction barrier or forms a heterojunction barrier lower than the first heterojunction barrier against charge having a polarity opposite to a polarity of the second signal charge and being in the second photoelectric conversion layer.

3. The imaging device according to claim 1,
   wherein height of the first heterojunction barrier is greater than or equal to 0.5 eV.

4. The imaging device according to claim 1, wherein
   in a case where a potential difference between the pixel electrode and the counter electrode is a first potential difference, the first signal charge does not pass through the first heterojunction barrier and is held in the first photoelectric conversion layer, and
   in a case where the potential difference between the pixel electrode and the counter electrode is a second potential difference which is larger than the first potential difference, the first signal charge passes through the first heterojunction barrier.

5. The imaging device according to claim 4, further comprising:
a voltage supply circuit electrically connected to the counter electrode, wherein
the voltage supply circuit supplies, in a first period, a first voltage to the counter electrode such that the potential difference between the pixel electrode and the counter electrode becomes the first potential difference, and
the voltage supply circuit supplies, in a second period which is different from the first period, a second voltage to the counter electrode such that the potential difference between the pixel electrode and the counter electrode becomes the second potential difference.

6. The imaging device according to claim 1, further comprising:
a third photoelectric conversion layer that is located between the second photoelectric conversion layer and the pixel electrode and that generates third signal charge; and
a second barrier layer that is located between the second photoelectric conversion layer and the third photoelectric conversion layer and that forms a second heterojunction barrier against the second signal charge in the second photoelectric conversion layer.

7. The imaging device according to claim 6,
wherein the first heterojunction barrier is higher than the second heterojunction barrier.

8. The imaging device according to claim 6,
wherein a thickness of the first barrier layer is greater than a thickness of the second barrier layer.

9. The imaging device according to claim 1,
wherein the first barrier layer contains a fullerene.

10. The imaging device according to claim 1,
wherein a spectral sensitivity characteristic of the first photoelectric conversion layer is different from a spectral sensitivity characteristic of the second photoelectric conversion layer.

11. The imaging device according to claim 10, wherein
the first photoelectric conversion layer is sensitive to visible light, and
the second photoelectric conversion layer is sensitive to infrared light.

12. The imaging device according to claim 10, wherein
the first photoelectric conversion layer is sensitive to infrared light, and
the second photoelectric conversion layer is sensitive to visible light.

13. The imaging device according to claim 1,
wherein a spectral sensitivity characteristic of the first photoelectric conversion layer is the same as a spectral sensitivity characteristic of the second photoelectric conversion layer.

14. A method for driving an imaging device including a photoelectric converter that includes a second photoelectric conversion layer, a barrier layer, a first photoelectric conversion layer, and a counter electrode are stacked on a pixel electrode in this order, the barrier layer forming a heterojunction barrier against first signal charge generated in the first photoelectric conversion layer, the method comprising:
(a) setting a potential difference between the pixel electrode and the counter electrode to a first potential difference, to cause a second signal charge generated in the second photoelectric conversion layer to be collected by the pixel electrode while the first signal charge is held in the first photoelectric conversion layer using the heterojunction barrier; and
(b) setting the potential difference between the pixel electrode and the counter electrode to a second potential difference which is larger than the first potential difference, to cause the first signal charge to pass through the heterojunction barrier and to be collected by the pixel electrode.

* * * * *